(12) United States Patent
Chang et al.

(10) Patent No.: US 11,527,518 B2
(45) Date of Patent: Dec. 13, 2022

(54) HEAT DISSIPATION IN SEMICONDUCTOR PACKAGES AND METHODS OF FORMING SAME

(71) Applicant: Taiwan Semiconductor Manufacturing Co., Ltd., Hsinchu (TW)

(72) Inventors: Fong-Yuan Chang, Hsinchu (TW); Po-Hsiang Huang, Tainan (TW); Lee-Chung Lu, Taipei (TW); Jyh Chwen Frank Lee, Palo Alto, CA (US); Yii-Chian Lu, Taipei (TW); Yu-Hao Chen, Hsinchu (TW); Keh-Jeng Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/157,520

(22) Filed: Jan. 25, 2021

(65) Prior Publication Data
US 2022/0028842 A1 Jan. 27, 2022

Related U.S. Application Data

(60) Provisional application No. 63/066,368, filed on Aug. 17, 2020, provisional application No. 63/056,754, filed on Jul. 27, 2020.

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC .............. H01L 25/105; H01L 21/4853; H01L 21/4857; H01L 21/4871; H01L 21/565;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

CN 109524314 A 3/2019
DE 112016007304 T5 6/2019
(Continued)

*Primary Examiner* — Fernando L Toledo
*Assistant Examiner* — Neil R Prasad
(74) *Attorney, Agent, or Firm* — Slater Matsil, LLP

(57) ABSTRACT

A semiconductor package includes a first package component comprising: a first semiconductor die; a first encapsulant around the first semiconductor die; and a first redistribution structure electrically connected to the semiconductor die. The semiconductor package further includes a second package component bonded to the first package component, wherein the second package component comprises a second semiconductor die; a heat spreader between the first semiconductor die and the second package component; and a second encapsulant between the first package component and the second package component, wherein the second encapsulant has a lower thermal conductivity than the heat spreader.

20 Claims, 32 Drawing Sheets

(51) Int. Cl.
- *H01L 21/56* (2006.01)
- *H01L 21/683* (2006.01)
- *H01L 23/31* (2006.01)
- *H01L 23/367* (2006.01)
- *H01L 23/538* (2006.01)
- *H01L 23/00* (2006.01)
- *H01L 25/065* (2006.01)
- *H01L 25/00* (2006.01)

(52) U.S. Cl.
CPC ........ *H01L 21/4871* (2013.01); *H01L 21/565* (2013.01); *H01L 21/6835* (2013.01); *H01L 23/3128* (2013.01); *H01L 23/367* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/0657* (2013.01); *H01L 25/50* (2013.01); *H01L 2221/68372* (2013.01); *H01L 2224/214* (2013.01); *H01L 2225/0651* (2013.01); *H01L 2225/06586* (2013.01); *H01L 2225/06589* (2013.01); *H01L 2225/1035* (2013.01); *H01L 2225/1058* (2013.01); *H01L 2225/1094* (2013.01)

(58) Field of Classification Search
CPC ............. H01L 21/6835; H01L 23/3128; H01L 23/367; H01L 23/5383; H01L 23/5386; H01L 23/5389; H01L 24/19; H01L 24/20; H01L 25/0657; H01L 25/50; H01L 2221/68372; H01L 2224/214; H01L 2225/0651; H01L 2225/06586; H01L 2225/06589; H01L 2225/1035; H01L 2225/1058; H01L 2225/1094

See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0117261 A1* | 4/2017 | Yu .......................... H01L 23/498 |
| 2019/0043772 A1* | 2/2019 | Muthursrinath .... H01L 23/4334 |
| 2019/0096791 A1 | 3/2019 | Jeng et al. |
| 2019/0148262 A1* | 5/2019 | Pei .......................... H01L 21/56 257/713 |
| 2019/0333836 A1 | 10/2019 | Lin et al. |
| 2020/0091034 A1 | 3/2020 | Shao et al. |
| 2020/0357721 A1* | 11/2020 | Sankman ............ H01L 23/3157 |
| 2020/0365486 A1* | 11/2020 | Huang .................... H01L 21/56 |
| 2021/0043612 A1* | 2/2021 | Lee ....................... H01L 23/3107 |
| 2021/0134731 A1 | 5/2021 | Guzek |
| 2021/0159147 A1 | 5/2021 | Lin et al. |
| 2021/0225750 A1 | 7/2021 | Yu et al. |

FOREIGN PATENT DOCUMENTS

| | | |
|---|---|---|
| DE | 102019115952 A1 | 1/2020 |
| WO | 2014150564 A1 | 9/2014 |

* cited by examiner

HEAT DISSIPATION IN SEMICONDUCTOR PACKAGES AND METHODS OF FORMING SAME

PRIORITY CLAIM AND CROSS-REFERENCE

This application claims the benefit of U.S. Provisional Application No. 63/056,754, filed on Jul. 27, 2020 and the benefit of U.S. Provisional Application No. 63/066,368, filed on Aug. 17, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
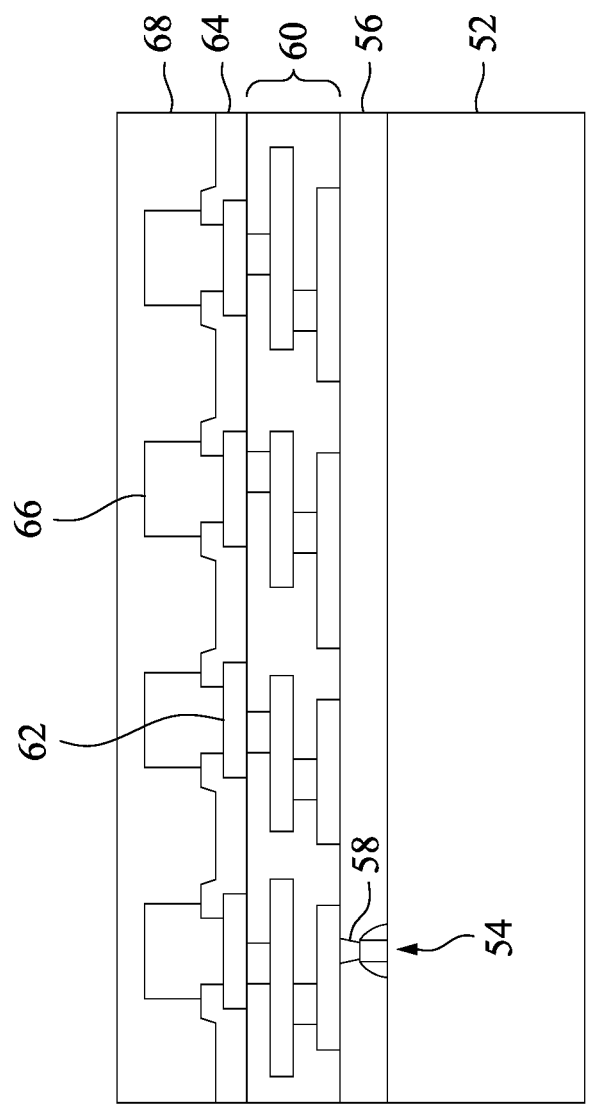
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package includes a memory package component bonded to an integrated circuit (IC) package component, which comprises one or more IC dies. In some embodiments, a heat spreader having a relatively high thermal conductivity is disposed between the memory package component and the IC package component for improved heat dissipation. For example, the heat spreader may be attached to a backside of the IC die, and the heat spreader may extend from the IC die to the memory package. In other embodiments, the IC die may be directly attached to the memory package for improved heat dissipation. According, in embodiment semiconductor packages, heat may be effectively dissipated from the IC die to the heat sink through the heat spreader or by directly attaching the IC die to the memory package.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that include multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

Figure 2:
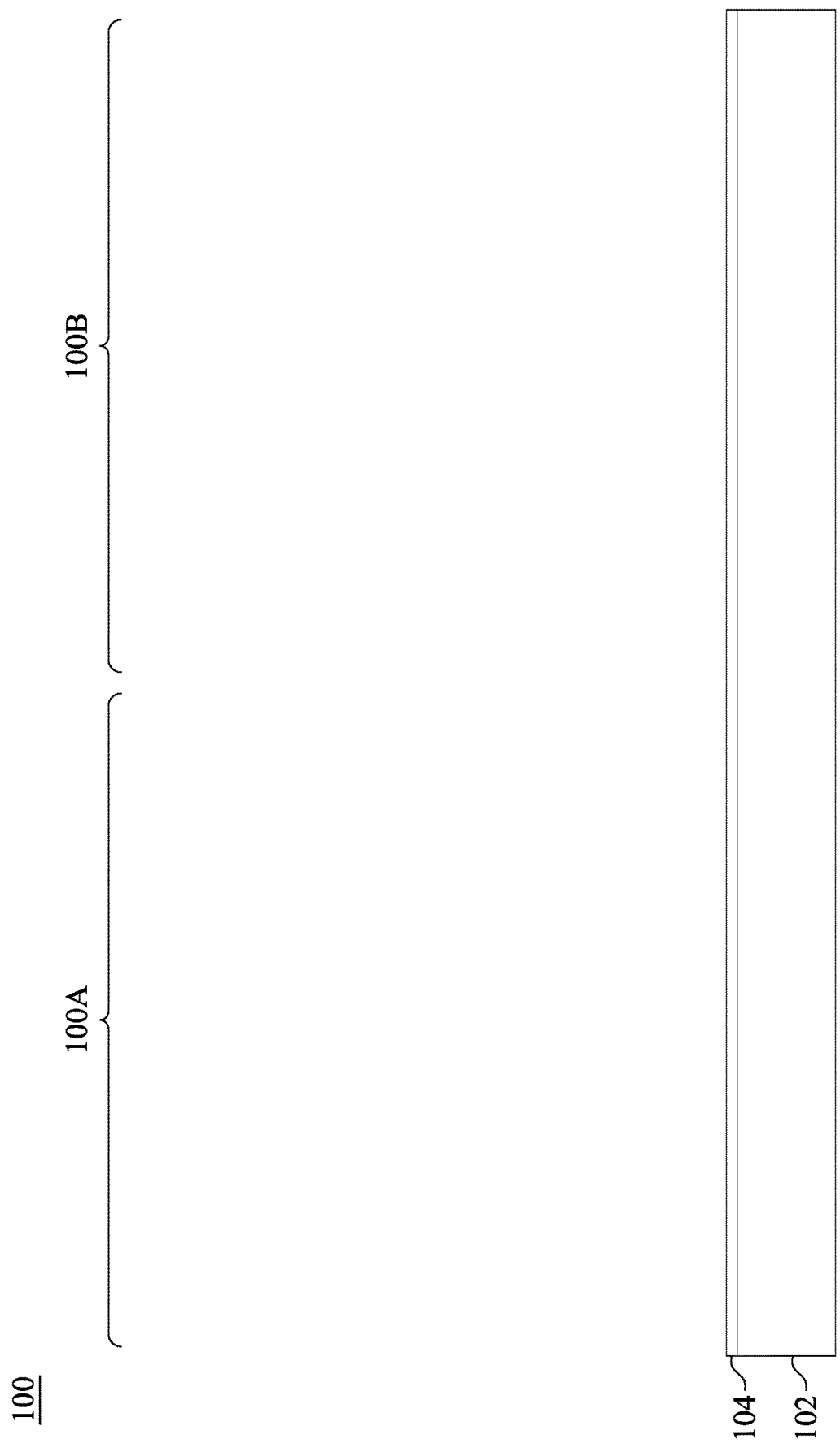
FIGS. 2 through 13 illustrate cross-sectional views of intermediate steps during a process for forming a semiconductor package in accordance with some embodiments.

FIGS. 2 through 13 illustrate cross-sectional views of manufacturing an integrated circuit package with improved heat dissipation according to some embodiments. In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. For example, a first package region 100A and a second package region 100B are illustrated, and one or more of the integrated circuit dies 50 are packaged to form an integrated circuit package in each of the package regions 100A and 100B. The completed integrated circuit packages may also be referred to as integrated fan-out (InFO) packages.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
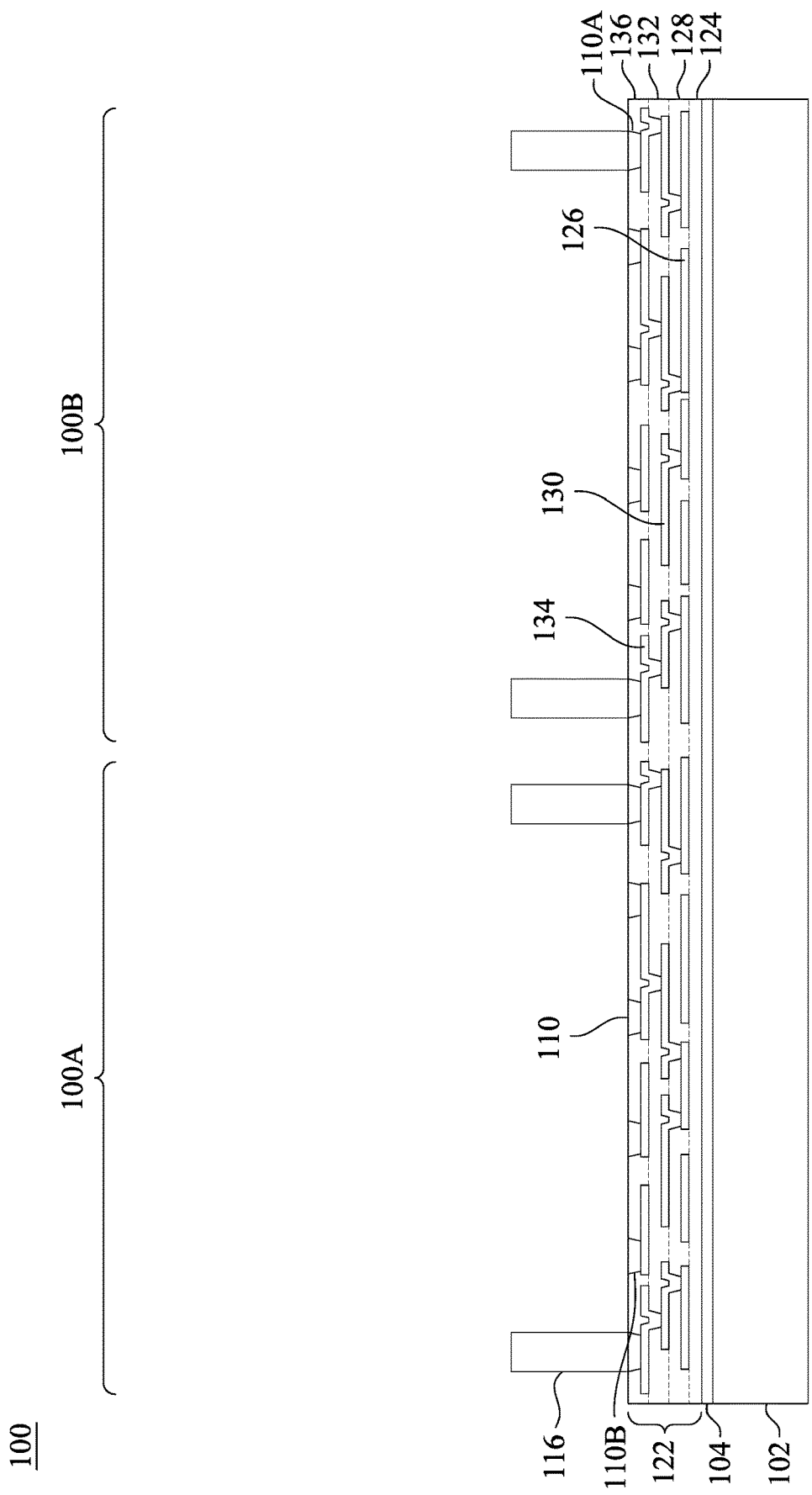

In FIG. 3, a front-side redistribution structure 122 is formed on the release layer 104. The front-side redistribution structure 122 includes dielectric layers 124, 128, 132, and 136; and metallization patterns 126, 130, 134, and 110 (including conductive pads 110A and 110B). The metallization patterns 126, 130, and 134 may also be referred to as redistribution layers or redistribution lines. The front-side redistribution structure 122 is shown as an example having four layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

As an example to form the redistribution structure 122, the dielectric layer 124 is deposited on the release layer 104. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof.

The metallization pattern 126 is then formed on the dielectric layer 124. As an example to form the metallization pattern 126, a seed layer is formed over the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 128 may then be deposited on the metallization pattern 126 and dielectric layer 124. The dielectric layer 128 may be formed in a manner similar to the dielectric layer 124, and may be formed of a similar material as the dielectric layer 124. Openings may be then be patterned through the dielectric layer 124 to expose the underlying metallization pattern 126. The patterning may be formed by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The metallization pattern 130 is then formed. The metallization pattern 130 includes portions on and extending along the major surface of the dielectric layer 128 and portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines of the metallization pattern 126. Further, the metallization pattern 130 may be formed to a greater pitch than the metallization pattern 126.

The dielectric layer 132 is deposited on the metallization pattern 130 and dielectric layer 128, and the dielectric layer 132 may be patterned to expose the metallization pattern 130. The dielectric layer 132 may be formed and patterned in a manner similar to the dielectric layer 124, and may be formed of a similar material as the dielectric layer 124.

The metallization pattern 134 is then formed. The metallization pattern 134 includes portions on and extending along the major surface of the dielectric layer 132 and portions extending through the dielectric layer 132 to physically and electrically couple the metallization pattern 130. The metallization pattern 134 may be formed in a similar manner and of a similar material as the metallization pattern 126. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

The dielectric layer 136 is deposited on the metallization pattern 134 and dielectric layer 132, and the dielectric layer 136 may be patterned to expose the metallization pattern 134. The dielectric layer 136 may be formed in a manner similar to the dielectric layer 124, and may be formed of the same material as the dielectric layer 124.

The metallization pattern 110 are then formed in the openings of the dielectric layer 136. The metallization patterns 110 includes conductive pads 110A and 110B, which extend through the dielectric layer 136 to physically and electrically couple to the underlying metallization patterns 134, 130, and 126.

As further illustrated by FIG. 3, through vias 116 are formed on the conductive pads 110A of the metallization pattern 110. The through vias 116 may extend away from the topmost dielectric layer of the redistribution structure 122 (e.g., the dielectric layer 136). As an example to form the through vias 116, a seed layer (not shown) is formed over the front-side redistribution structure 122, e.g., on the dielectric layer 136 and the metallization pattern 110. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. Alternatively, in embodiments where the vias 116 are not wider than the underlying conductive pads 110A, a separate seed layer may be omitted, and the conductive pads 110A may act as the seed layer.

A photoresist is formed and patterned on the seed layer (if present) and the front-side redistribution structure 122. The photoresist may be formed by spin coating or the like and may be exposed to light for patterning. The pattern of the photoresist corresponds to through vias 116. The patterning forms openings through the photoresist to expose the seed layer or the conductive pads 110A. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer (if present) are removed, such as by using an acceptable etching process, such as by wet or dry etching. The remaining portions of the seed layer and conductive material form the through vias 116.

Figure 4:
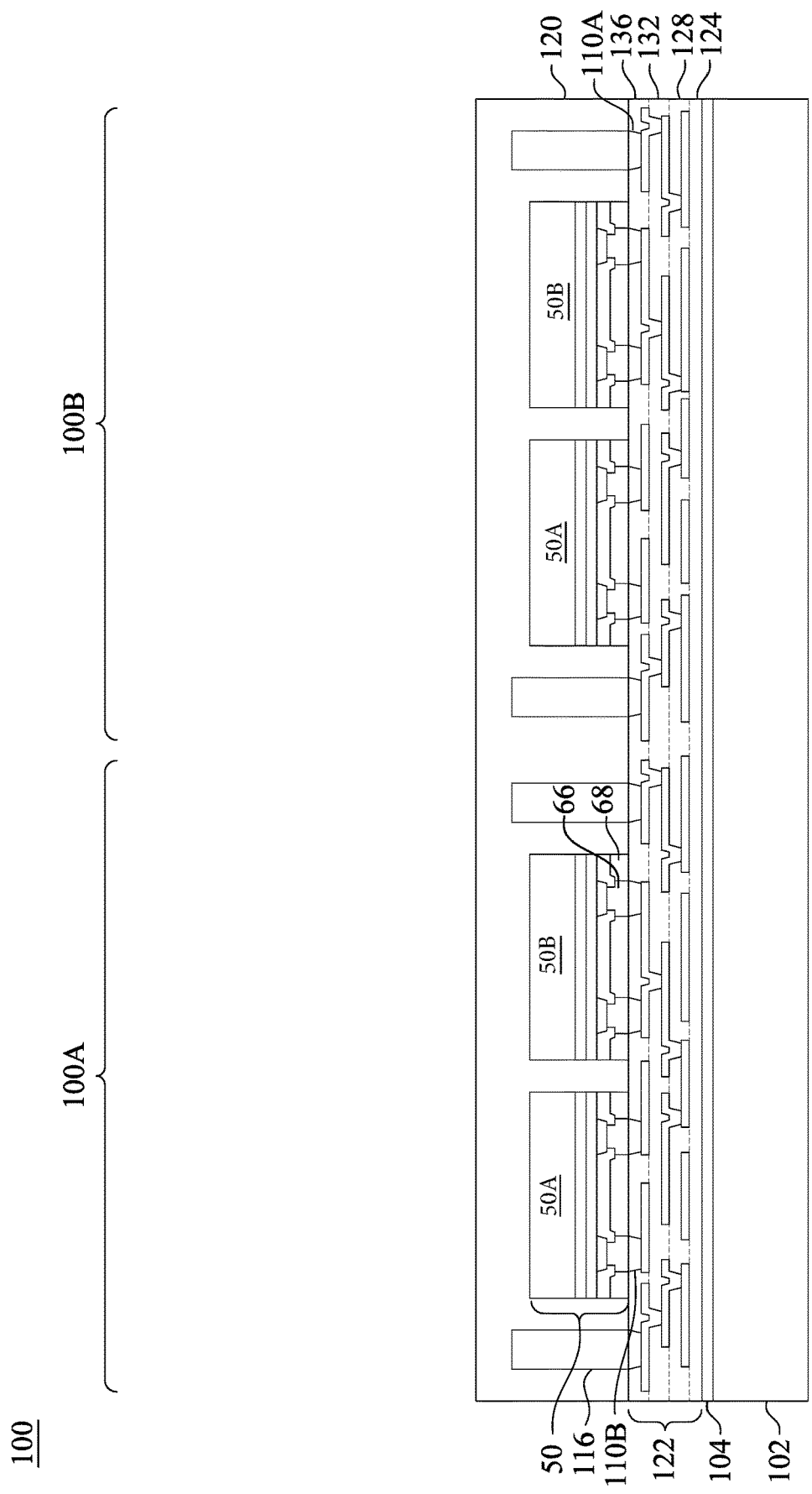

In FIG. 4, integrated circuit dies 50 (e.g., a first integrated circuit die 50A and a second integrated circuit die 50B) are bonded in each of the package regions 100A and 100B. In the embodiment shown, multiple integrated circuit dies 50 are bonded adjacent one another, including the first integrated circuit die 50A and the second integrated circuit die 50B in each of the first package region 100A and the second package region 100B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). Although two integrated circuit dies 50 are illustrated as being placed in each of the package regions, a fewer (e.g., one) or a greater number of integrated circuit dies maybe disposed in each of the package regions on the substrate 102.

The dies 50 are disposed face down such that the front sides of the dies 50 face the conductive pads 110B, and the back sides of the dies 50 face away from the conductive pads 110B. In some embodiments, the integrated circuit dies 50 are bonded to the conductive pads 110B of the metallization pattern 110 in a hybrid bonding configuration. For example, the passivation layer 68 of the dies 50 may be directly bonded to the dielectric layer 136, and contact pads 66 of the dies 50 may be directly bonded to the conductive pads 110B. In an embodiment, the bond between the passivation layer 68 and the dielectric layer 136 may be an oxide-to-oxide bond, or the like. The hybrid bonding process further directly bonds the contact pads 66 of the die 50 to the conductive pads 110B through direct metal-to-metal bonding. Thus, electrical connection between the dies 50 and the front-side redistribution structure 122 is provided by the physical connection of the contact pads 66 to the contact pads 110B.

As an example, the hybrid bonding process may start by applying a surface treatment to the dielectric layer 136 of the front-side redistribution structure 122 and/or the passivation layer 68 of the dies 50. The surface treatment may include a plasma treatment. The plasma treatment may be performed in a vacuum environment. After the plasma treatment, the surface treatment may further include a cleaning process (e.g., a rinse with deionized water, or the like) that may be applied to the dielectric layer 136 and/or the passivation layer 68 of the dies 50. The hybrid bonding process may then proceed to aligning the contact pads 66 to the contact pads 110B. Next, the hybrid bonding includes a pre-bonding step, during which the contact pads 66 are put in physical contact with the contact pads 110B. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in contact pads 66 (e.g., copper) and the metal of the contact pads 110B (e.g., copper) inter-diffuses to each other, and hence the direct metal-to-metal bonding is formed. The anneal may further form covalent bonds between the passivation layer 68 and the dielectric layer 136. Other bonding parameters and/or methods (e.g., solder bonding) are also possible in other embodiments.

As further illustrated in FIG. 4, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

Figure 5:
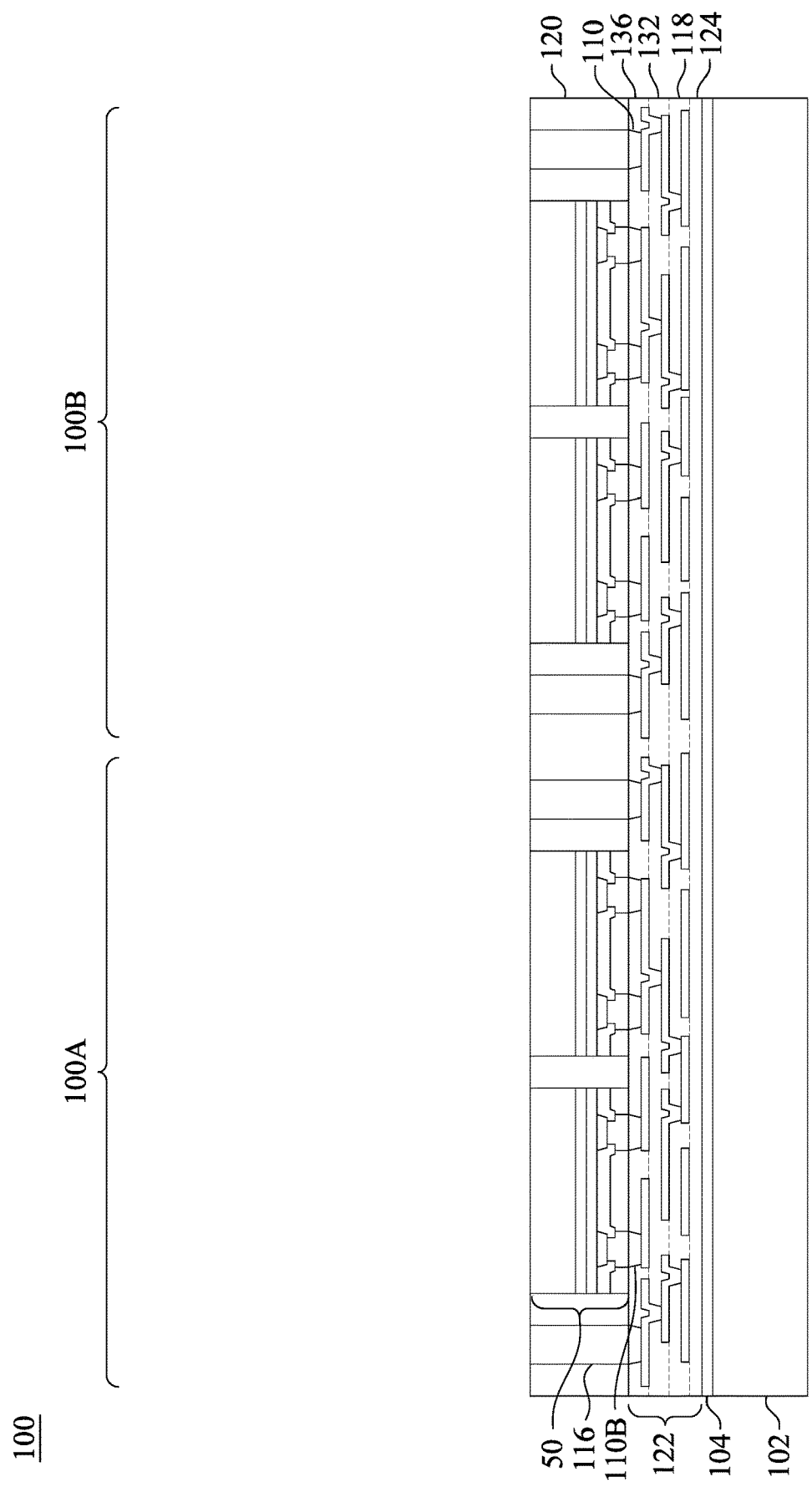

In FIG. 5, a planarization process is performed on the encapsulant 120 to expose the through vias 116 and the dies 50. The planarization process may also remove material of the through vias 116. Top surfaces of the through vias 116, the dies 50, and the encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and the dies 50 are already exposed.

Figure 6:
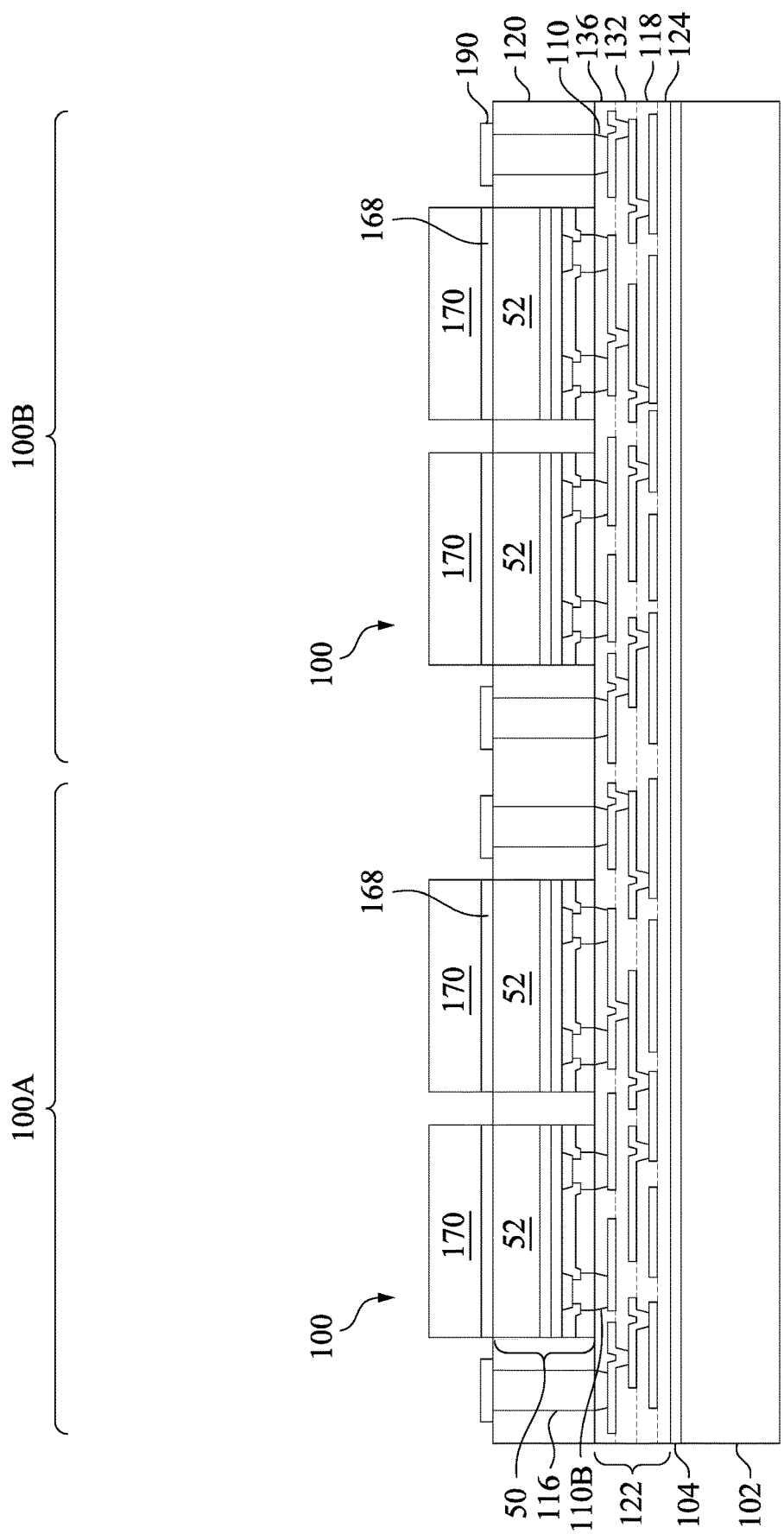

In FIG. 6, heat spreaders 170 are attached to the dies 50 by a film 168. The heat spreaders 170 may be formed of a conductive material with a relatively high thermal conductivity, such as at least about 149 W/m*K or at least about 380 W/m*K. For example, in some embodiments, the heat spreaders 170 are made of copper, diamond, boron arsenide, silver, silicon, or the like, or the like. It has been described that when the heat spreaders 170 are formed of a material with a thermal conductivity less than about 380 W/m*K, thermal dissipation is insufficient in the resulting package. The heat spreaders 170 may attached to a backside of the substrates 52 of the dies 50 using a film 168. The backside of the substrate 52 may refer to a side opposite a surface on which active devices are formed. The film 168 may be a high-k polymer (e.g., a high-k DAF), a metal (e.g., In, Sn, or the like) attached by a reflow process, a thermal interface material (TIM), solder paste, or the like. In the illustrated embodiment, each of the heat spreader 170 has a same width as and is coterminous with a respective one of the dies 50. In other embodiments, the heat spreaders 170 may be wider or narrower than the dies 50, and/or sidewalls of the heat spreaders 170 may be offset from the dies 150 (see e.g., FIGS. 14A-14C). Further, multiple physically separated heat spreaders 170 may be attached to each of the dies 50 (see e.g., FIGS. 14A-14C).

As further illustrated in FIG. 6, metallization pattern 190 may be formed on the through vias 116. The metallization pattern 190 may be formed using a similar process and a similar material as described above with respect to the contact pads 110B. In various embodiments, the metallization pattern 190 may be formed before or after the heat spreaders 170 are attached to the dies 50.

Thus, a first package component 100 is formed in each of the package regions 100A and 100B. The first package component 100 includes the integrated circuit dies 50, the encapsulant 120, the through vias 116, the front-side redistribution structure 122, and the metallization pattern 190. The heat spreaders 170 formed on the integrated circuit dies of the 50 of the first package components 100.

Figure 7:
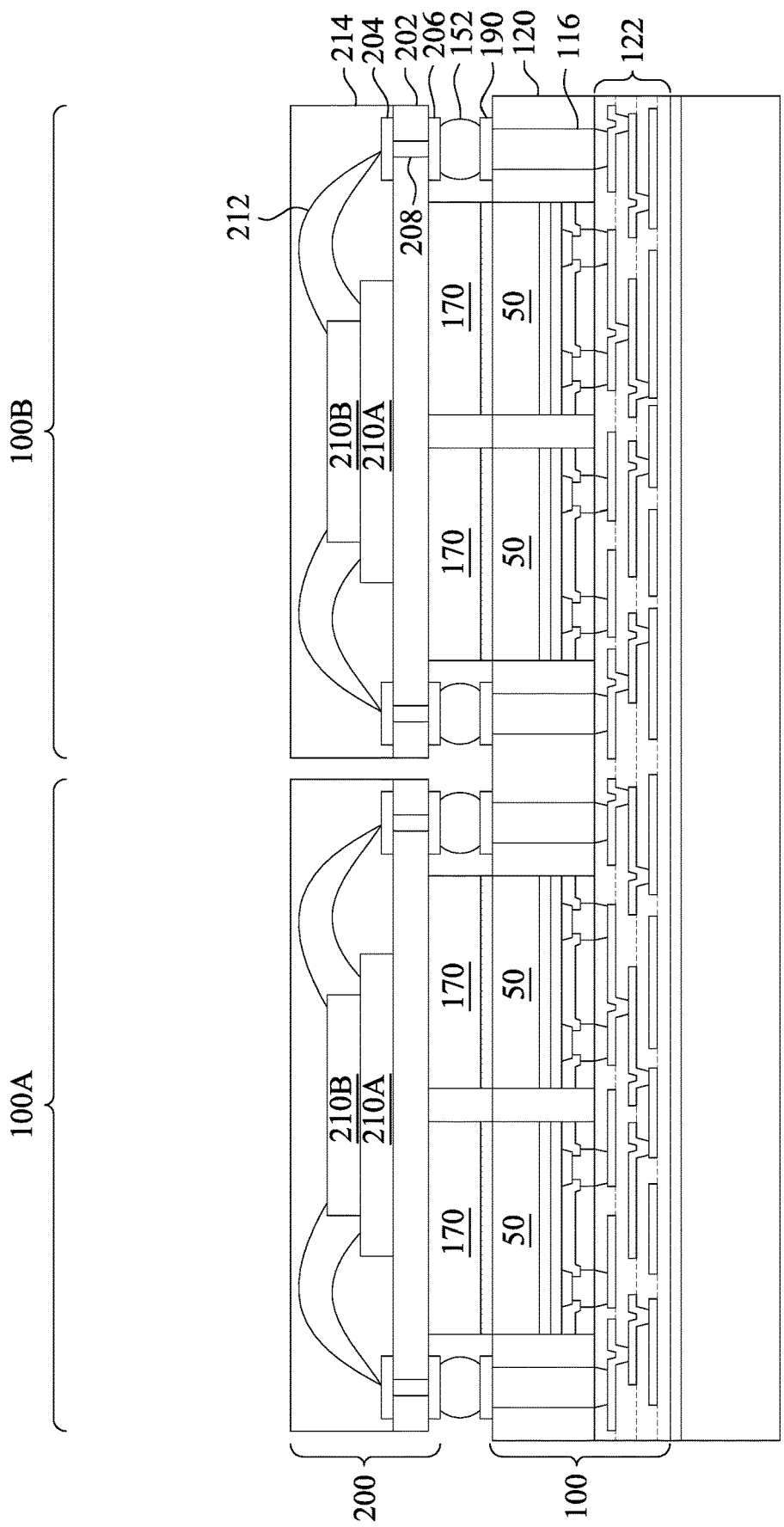

In FIG. 7, second package components 200 are coupled to the first package component 100 by conductive connectors 152. One of the second package components 200 are coupled in each of the package regions 100A and 100B to form an integrated circuit device stack on each of the package regions. In some embodiments, the second package components 200 may physically contact the heat spreaders 170. For example, the heat spreaders 170 may span a distance between the dies 50 and the second package components 200. In this manner, the heat spreaders 170 may provide thermal dissipation paths from the dies 50 to the second package components 200. In other embodiments, an intermediate layer may be disposed between the heat spreaders 170 and the second package components 200. For example, a thermally conductive film (not explicitly illustrated) may be used as a buffer layer between each of the heat spreaders 170 and a respective second package component 200. In some embodiments, the thermally conductive film may comprise a high-k polymer (e.g., a high-k DAF), a metal (e.g., In, Sn, or the like) attached by a reflow process, a TIM, solder paste, or the like.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and the metallization pattern 190. In some embodiments, the stacked dies 210 may be coupled to the integrated circuit dies 50A and 50B through the wire bonds 212, the bond pads 204 and 206, conductive vias 208, the conductive connectors 152, the metallization pattern 190, the through vias 116, and the front-side redistribution structure 122.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the first package component 100.

Figure 8:
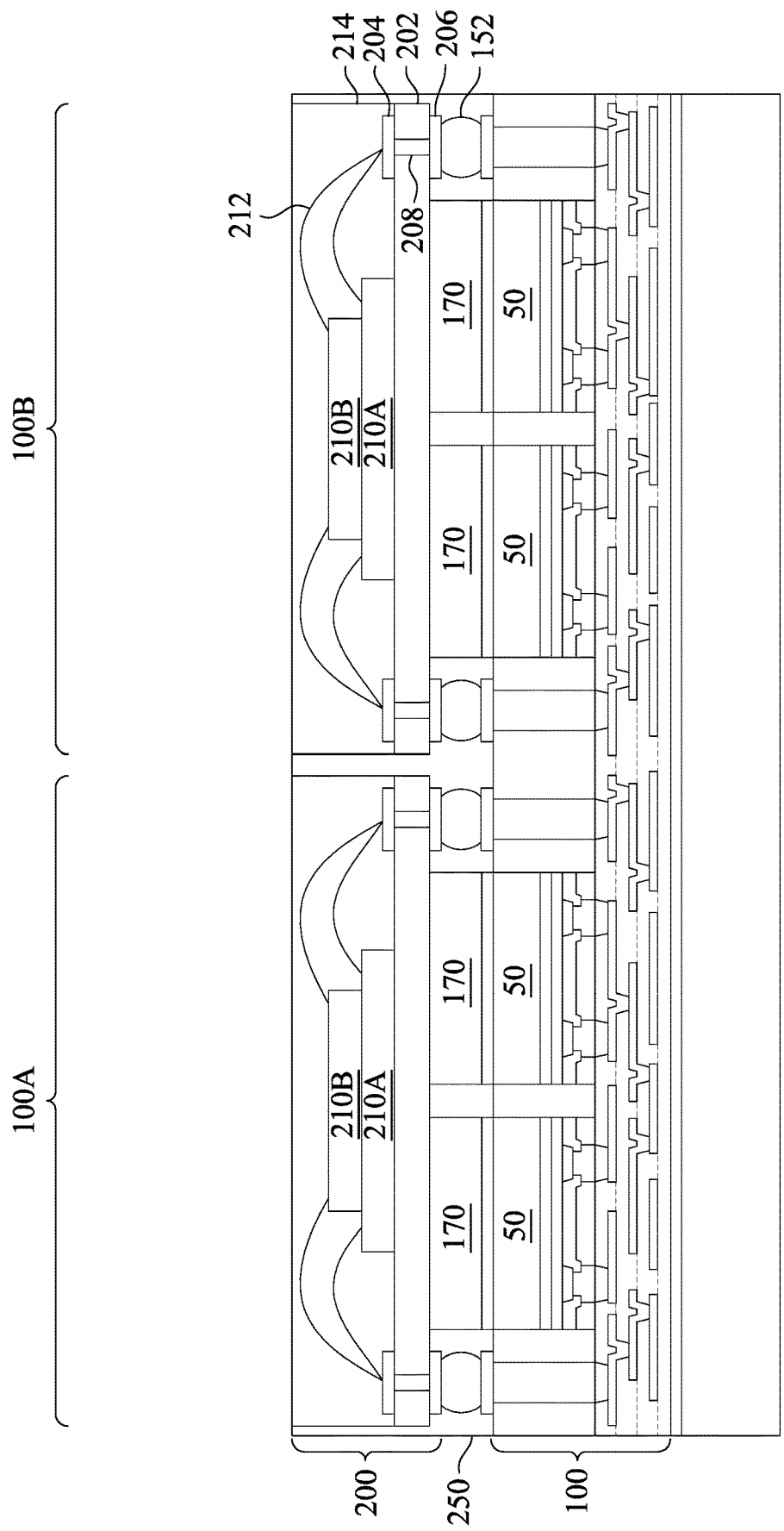

In FIG. 8, an encapsulant 250 is formed between the first package component 100 and the second package components 200, surrounding the conductive connectors 152 and the heat spreader 170. The encapsulant 250 may further be formed around the second package component 200, and the encapsulant 250 may be formed around the first package component 100 (not explicitly illustrated). The encapsulant 250 may be a molding compound, epoxy, a molding underfill, or the like. In some embodiments, the encapsulant 250 may have a lower thermal conductivity than the heat spreaders 170. For example, the encapsulant 250 may have a thermal conductivity less than about 10 W/m*K. Accordingly, the heat spreaders 170 allow for improved thermal dissipation from the integrated circuit dies 50 to the second package components 200 through the encapsulant 250. For example, by including the heat spreaders 170 through the encapsulant 250, an operating temperature decrease of about 22% or more has been observed.

The encapsulant 250 may be applied by compression molding, transfer molding, or the like, and may be formed over second package component 200 until the second package component 200 is buried or covered. The encapsulant 250 is further formed in gap regions between the second package component 200 and the underlying first package component 100. The encapsulant 250 may be applied in liquid or semi-liquid form and then subsequently cured. After the encapsulant 250 is formed, a planarization process (e.g., a CMP, grinding, or the like) may be applied to the encapsulant 250 until the second package components 200 are exposed. After the planarization process, top surfaces of the second package components 200 and the encapsulant 250 may be level.

Figure 9:
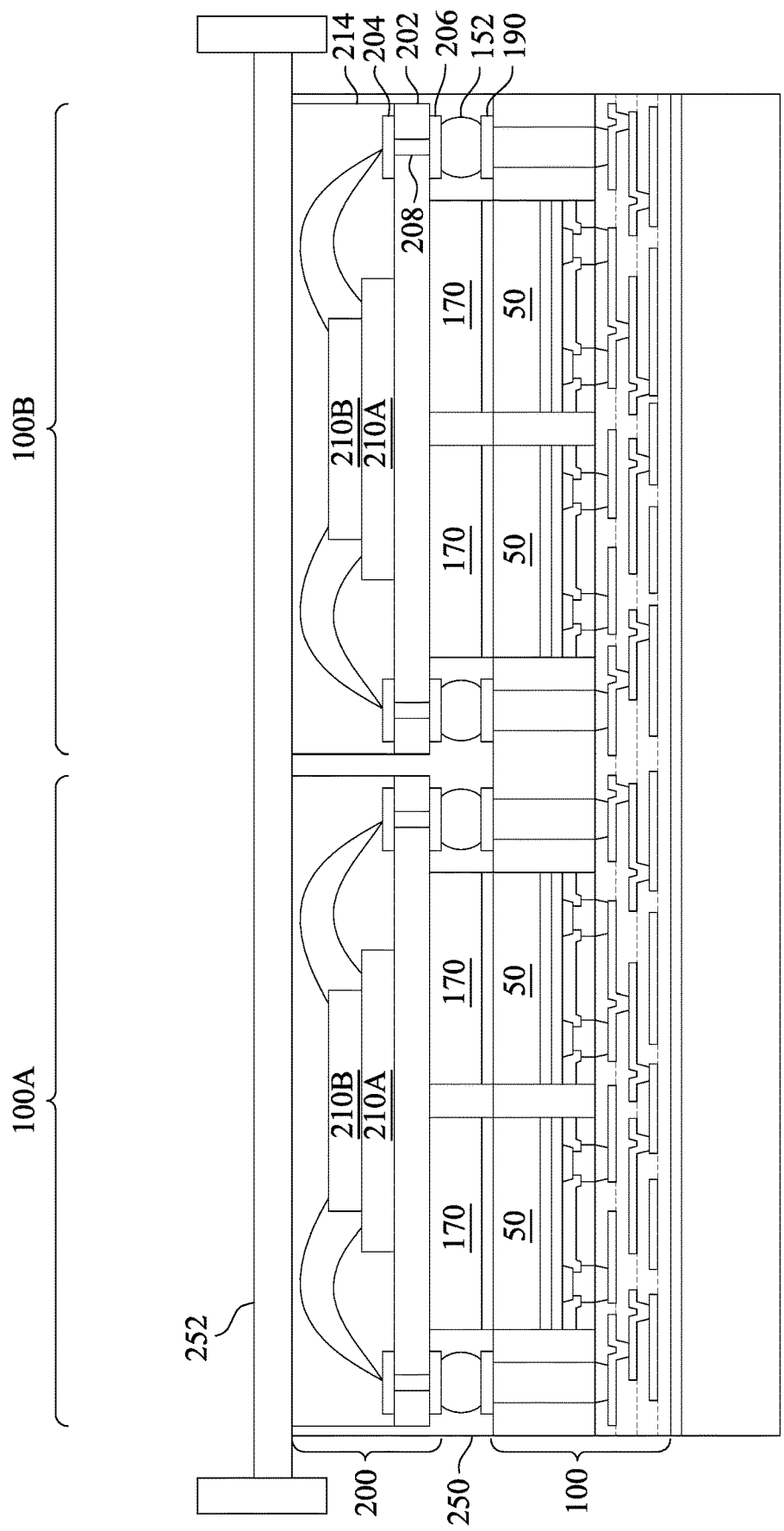

In FIG. 9, a frame 252 is attached to the second package component 200. For example, the frame 252 is attached to a surface of the second package component 200 opposite the first package component 100.

Figure 10:
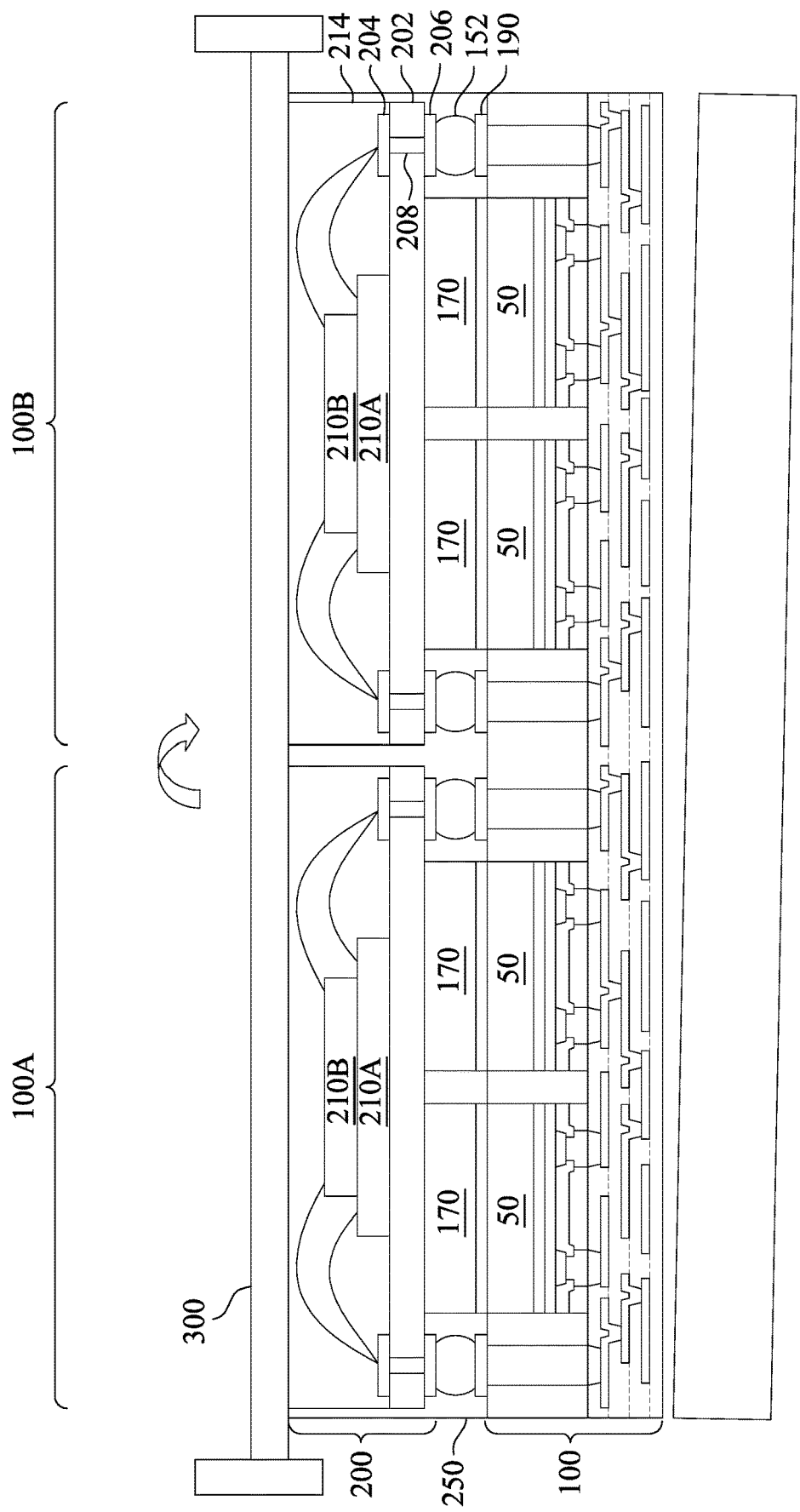

In FIG. 10, a carrier substrate de-bonding is performed to detach (or "de-bond") the carrier substrate 102 from the front-side redistribution structure 122, e.g., the dielectric layer 124. In accordance with some embodiments, the de-bonding includes projecting a light such as a laser light or an UV light on the release layer 104 so that the release layer 104 decomposes under the heat of the light and the carrier substrate 102 can be removed. The structure is then flipped over.

Figure 11:
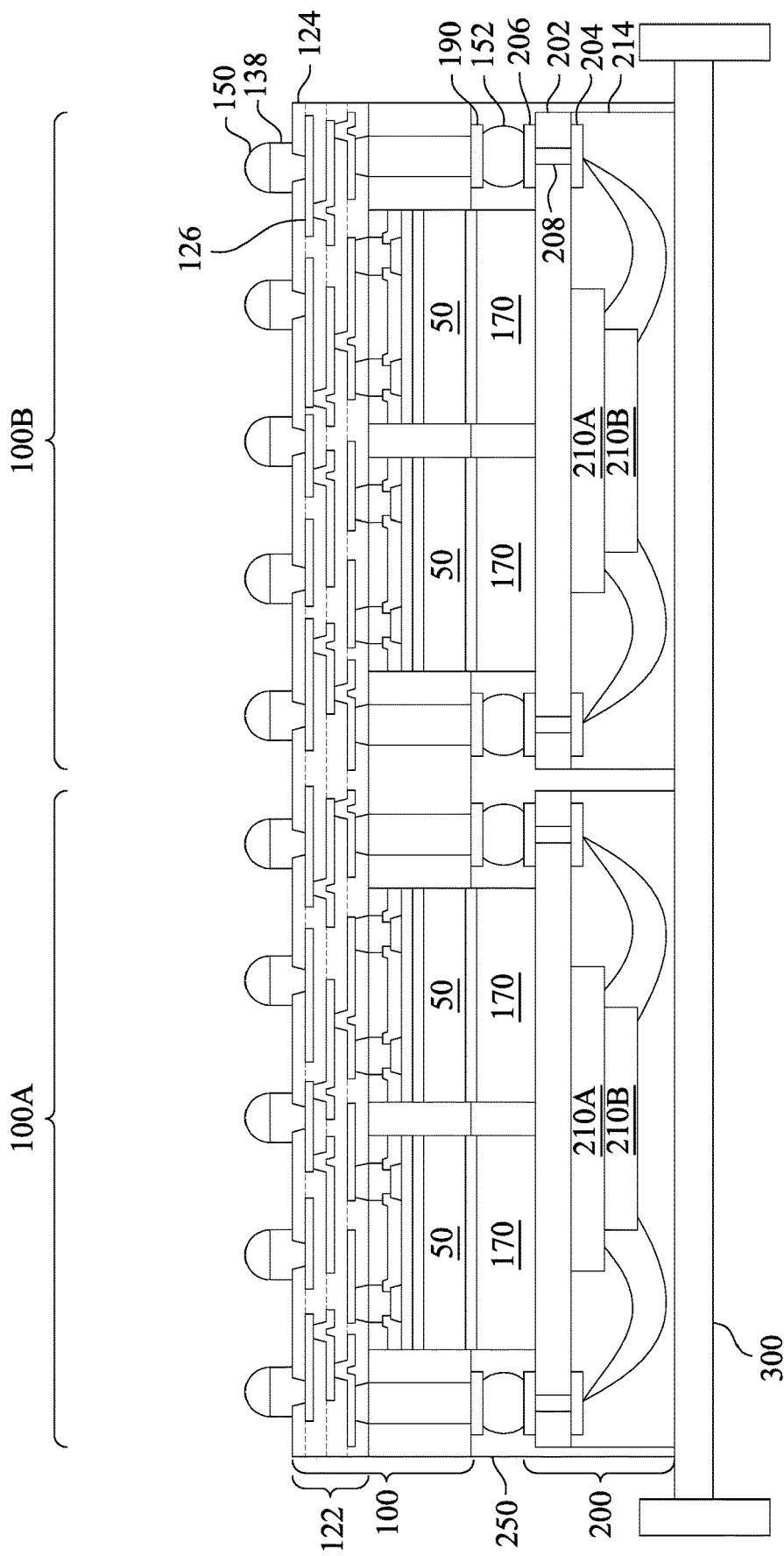

In FIG. 11, UBMs 138 and conductive connectors 150 are formed for external connection to the front-side redistribution structure 122. The UBMs 138 have bump portions on and extending along the major surface of the dielectric layer 124, and have via portions extending through the dielectric layer 124 to physically and electrically couple the metallization patterns 126. As a result, the UBMs 138 are electrically coupled to the through vias 116 and the integrated circuit dies 50. The UBMs 138 may be formed of the same material and in a same process as the metallization pattern 126. In some embodiments, the UBMs 138 has a different size than the metallization patterns 110, 126, 130, and 134.

In FIG. 11, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
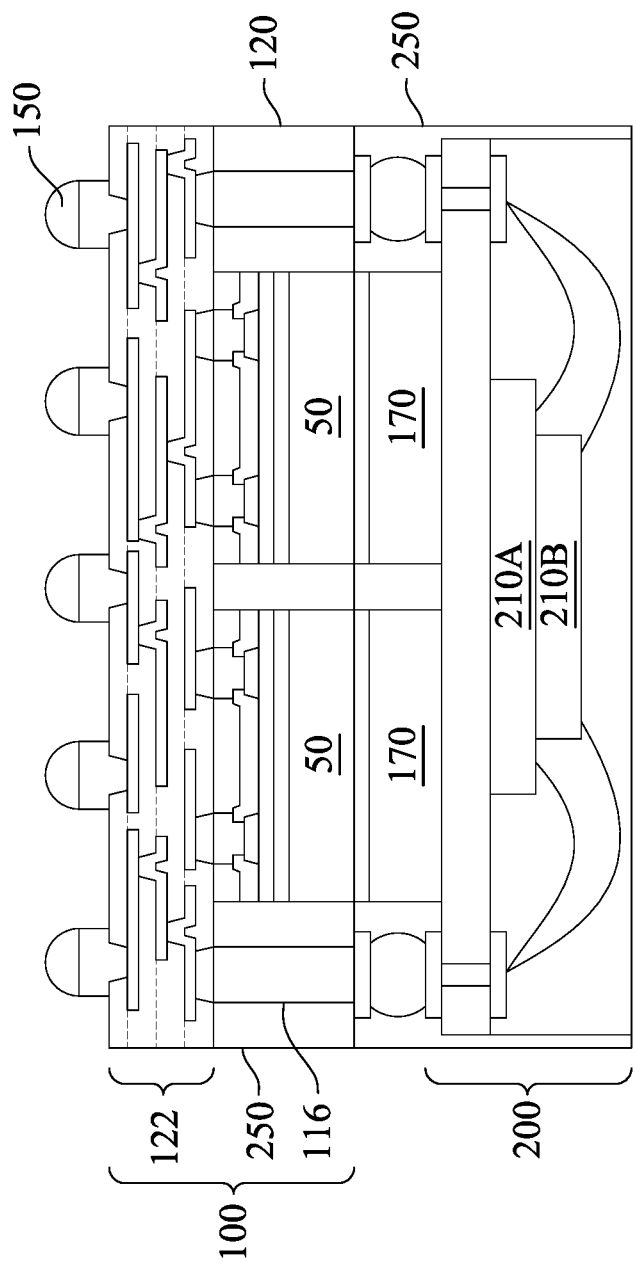

In FIG. 12, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments (not shown), the singulation process is performed before the second package components 200 are coupled to the first package component 100.

Figure 13:
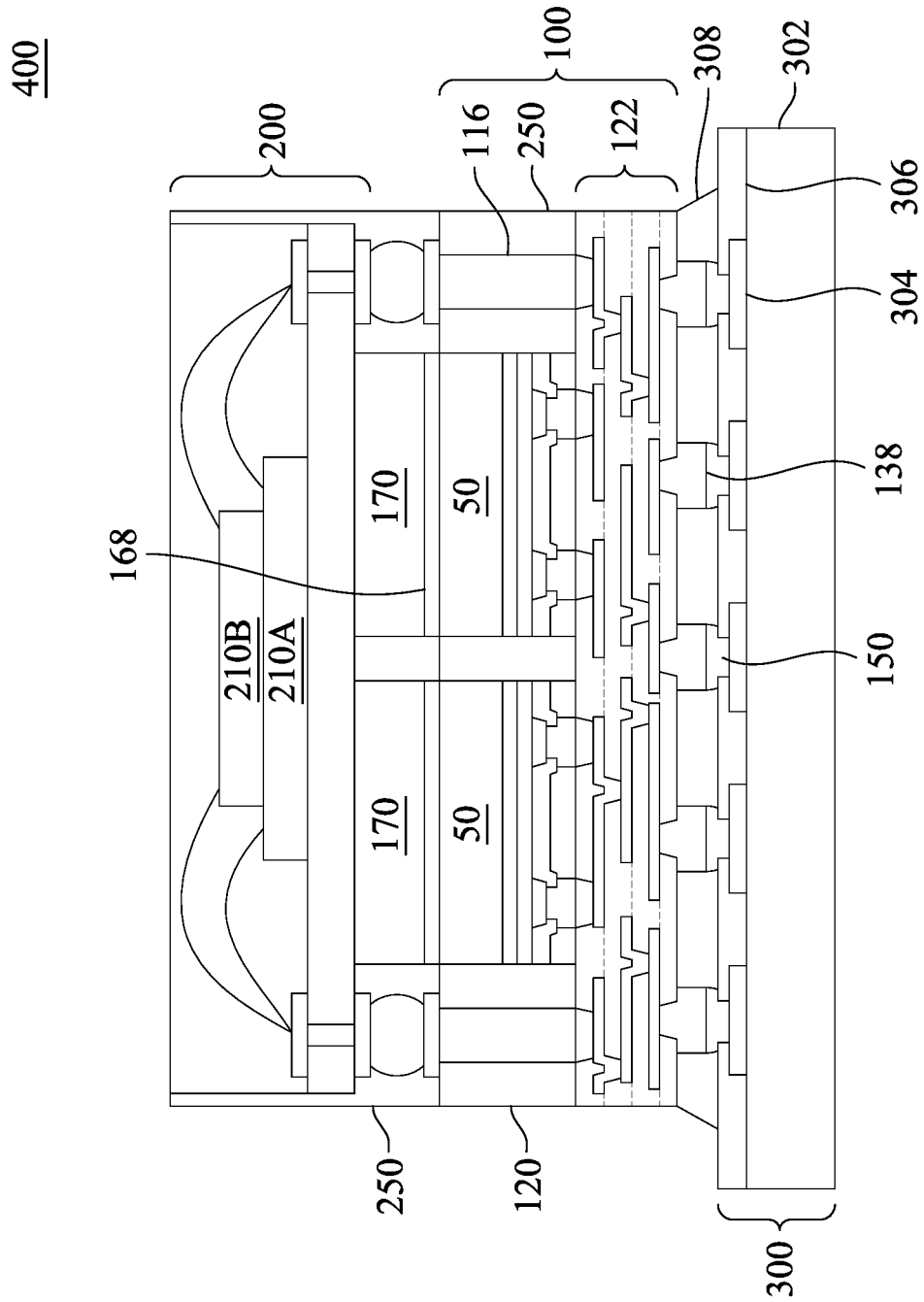

In FIG. 13, each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4.

Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Thus, a semiconductor package 400 is formed comprising the first package component 100 bonded to the second package component 200 and the third package component 300. One or more heat spreaders 170 are disposed between the first package component 100 and the second package component 200 to improve heat dissipation from dies 50 of the first package component 100 through the second package component 200. The heat spreaders 170 may have a relatively high thermal conductivity, for example, higher than a thermal conductivity of the encapsulant 250 between the first package component 100 and the second package component 200. As such, improved heat dissipation and device performance can be achieved in the semiconductor package 400. For example, operating temperatures in the semiconductor package 400 may be reduced by 22% or more through the inclusion of the heat spreaders 170.

Figure 14A:
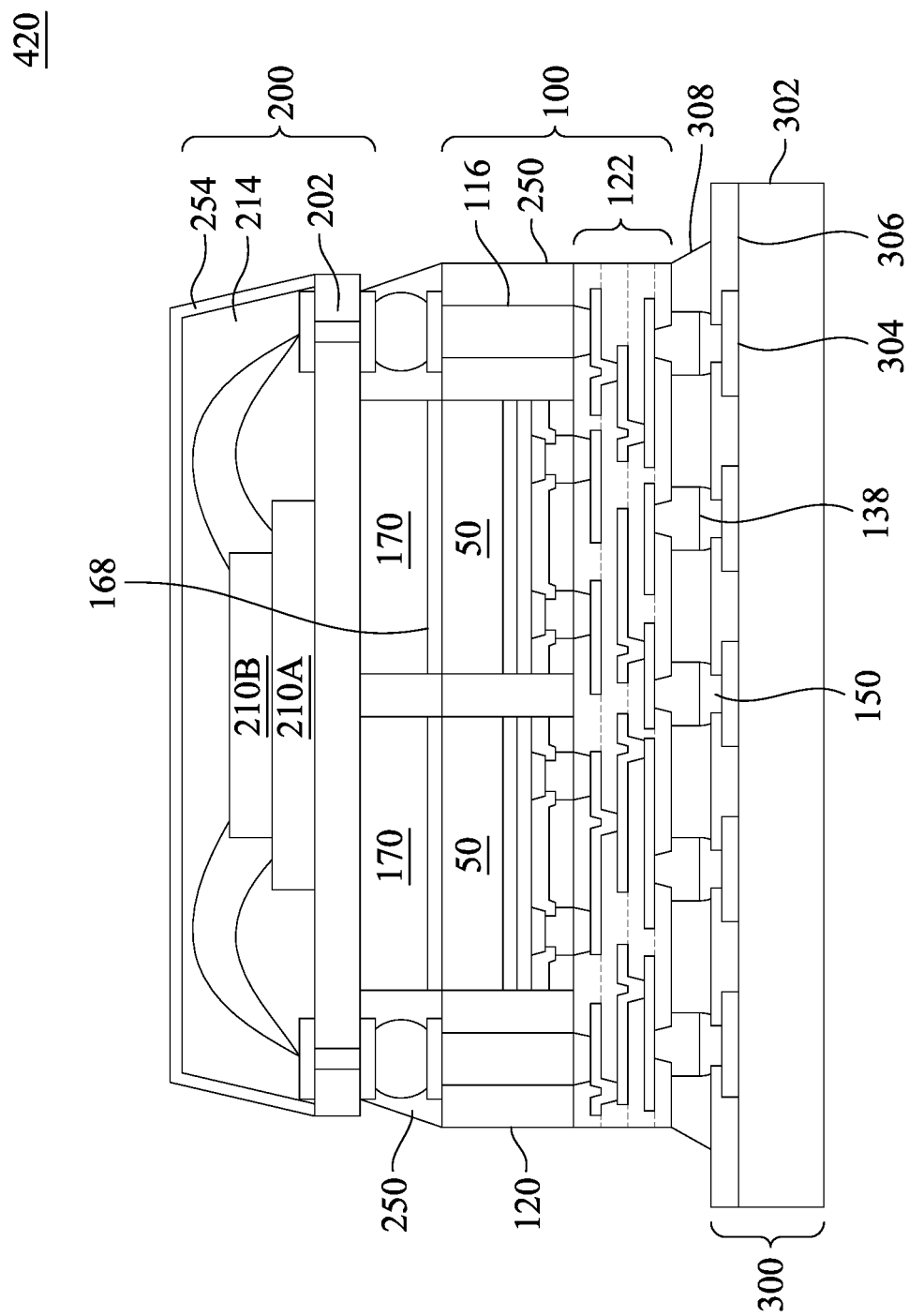
FIGS. 14A, 14B, and 14C illustrate cross-sectional views of semiconductor packages in accordance with some embodiments.
Figure 14B:
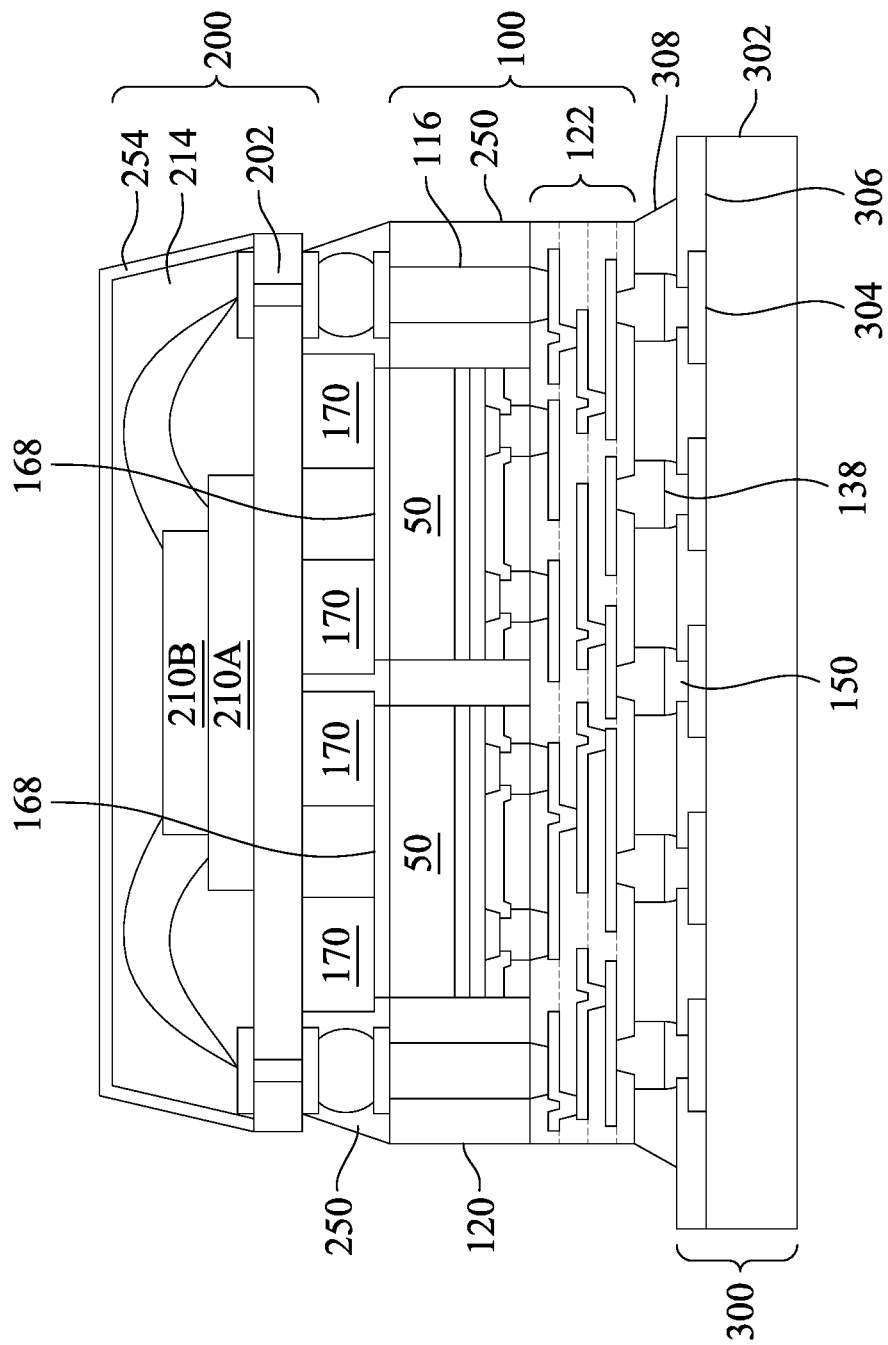
Figure 14C:
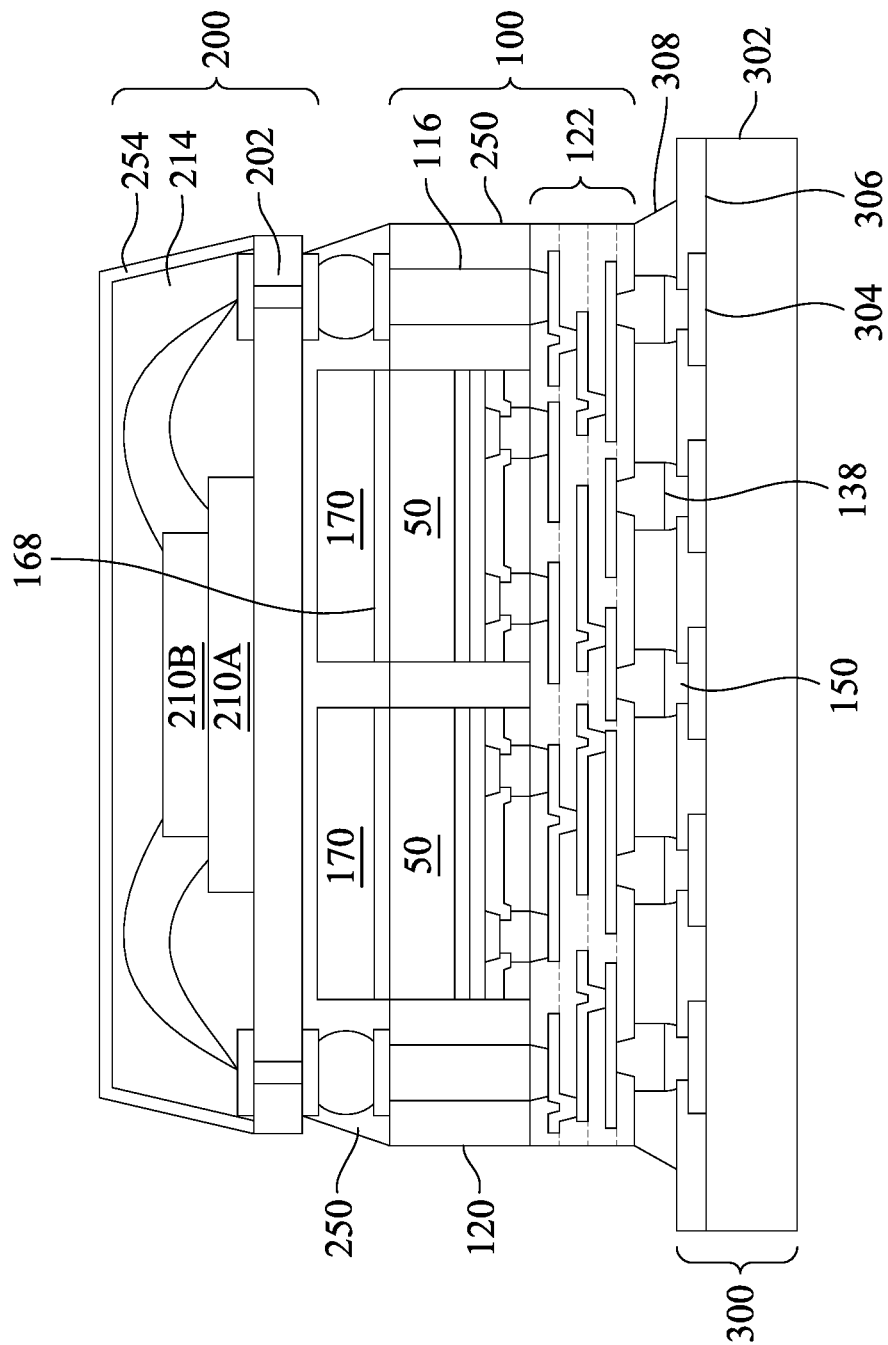
Figure 15:
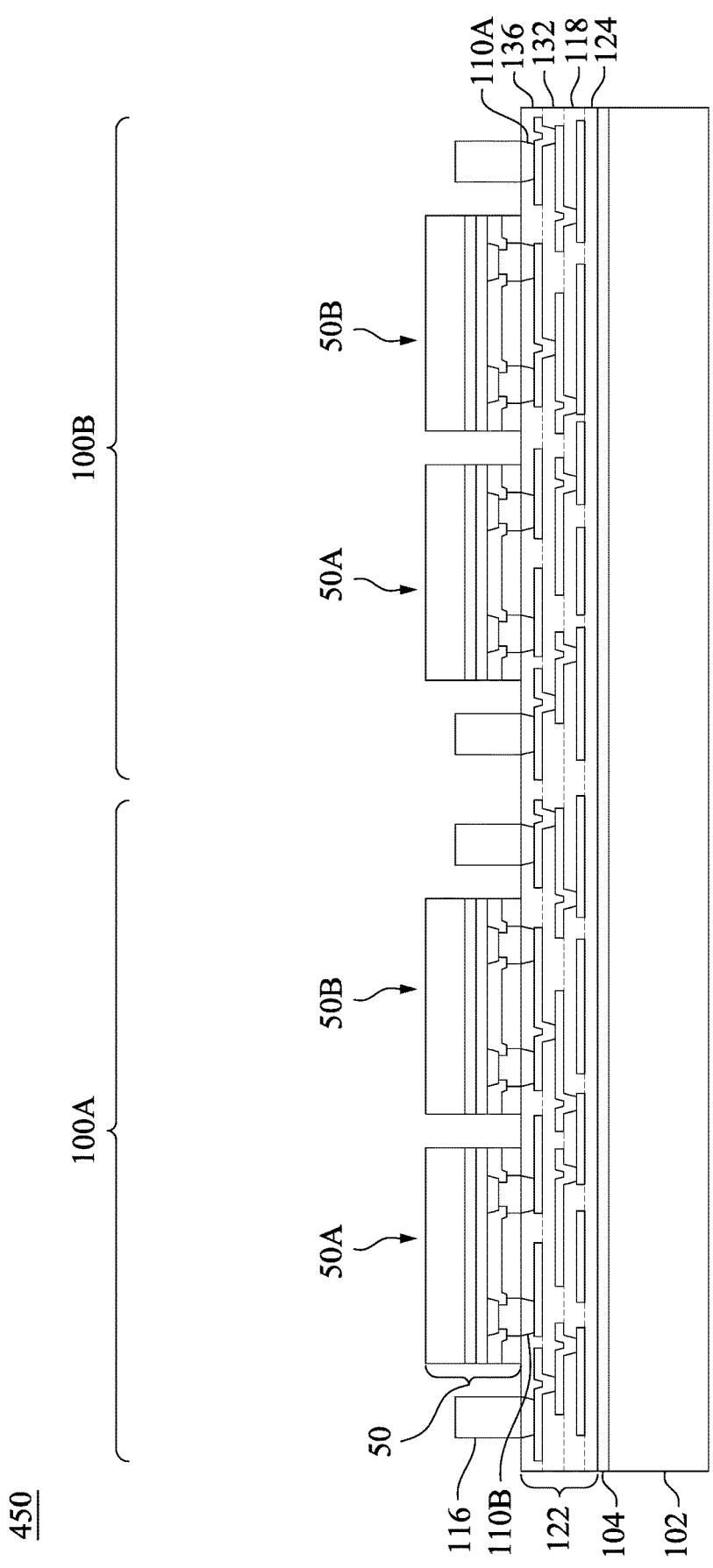
FIGS. 15 through 19 illustrate cross-sectional views of intermediate steps during a process for forming a semiconductor package in accordance with some embodiments.

FIGS. 14A, 14B, and 14C illustrate cross-sectional views of semiconductor packages 420, 430, and 440, respectively. Each of the semiconductor packages 420, 430, and 440 may be similar to the semiconductor package 400 and each other where like reference numerals indicate like elements formed using like processes. However, the second package component 200 in each of the semiconductor packages 420, 430, and 440 may further include a heat dissipation lid 254, which is attached to the substrate 202 of the second package component 200. The heat dissipation lid 254 may be made of a conductive material with relatively high thermal conductivity, such as copper or the like, and the heat dissipation lid 254 may be attached to the top surface of the substrate 202 by an adhesive, a thermal interface material (TIM), or the like. The substrate 202 thermally connects the heat spreaders 170 to the heat dissipation lid 254. As such, heat may be dissipated from the dies 50 to the heat dissipation lid 254 through the heat spreaders 170 and the substrate 202. Further, in packages 420, 430, and 440, the encapsulant 250 may only be formed between the first package component 100 and the second package component 200, and the encapsulant 250 may not extend along the sidewalls of the second package component 200.

The package 420 of FIG. 14A illustrates an embodiment where the heat spreaders 170 are a same width as and coterminous with the dies 50. Further, the heat spreaders 170 in the package 320 may contact the substrate 202, and the heat spreaders 170 may span an entire distance between the dies 50 and the substrate 202.

The package 430 of FIG. 14B illustrates an embodiment where the heat spreaders 170 are a narrower than and offset from the dies 50, and multiple heat spreaders 170 are attached to each of the dies 50. For example, in the package 430, the heat spreaders 170 may overlap sidewalls of the dies 50. Further, the heat spreaders 170 in the package 330 may contact the substrate 202, and the heat spreaders 170 may span an entire distance between the dies 50 and the substrate 202.

The package 340 of FIG. 14C illustrates an embodiment where the heat spreaders 170 are a same width as and coterminous with the dies 50. Further, the heat spreaders 170 in the package 320 may be physically separated from the substrate 202 by the encapsulant 250. For example, the heat spreaders 170 may not be attached to the package 200, and the encapsulant 250 may be formed between a top surface of the heat spreaders 170 and a bottom surface of the substrate 202. Although the heat spreaders 170 do not contact the substrate 202, the inclusion of the heat spreaders 170 within the encapsulant 250 still improves heat dissipation between the first and second package components 100 and 200.

FIGS. 15 through 19 illustrate cross-sectional views of forming a semiconductor package 450 according to some other embodiments. Package 450 may be similar to package 400 of FIG. 12 where like reference numerals indicate like elements formed by like processes. FIG. 14 illustrates a cross-sectional view at a similar stage of process as FIG. 4, above, but prior to the formation of the encapsulant 120. For example, in FIG. 14, a front-side redistribution structure 122 is formed on a carrier substrate 102, through vias 116 are formed on contact pads 110A of the front-side redistribution structure 122, and dies 50 are bonded to contact pads 110B of the front-side redistribution structure 122. However, in the structure of FIG. 14, the dies 50 may be taller and extend higher than the through vias 116.

Figure 16:
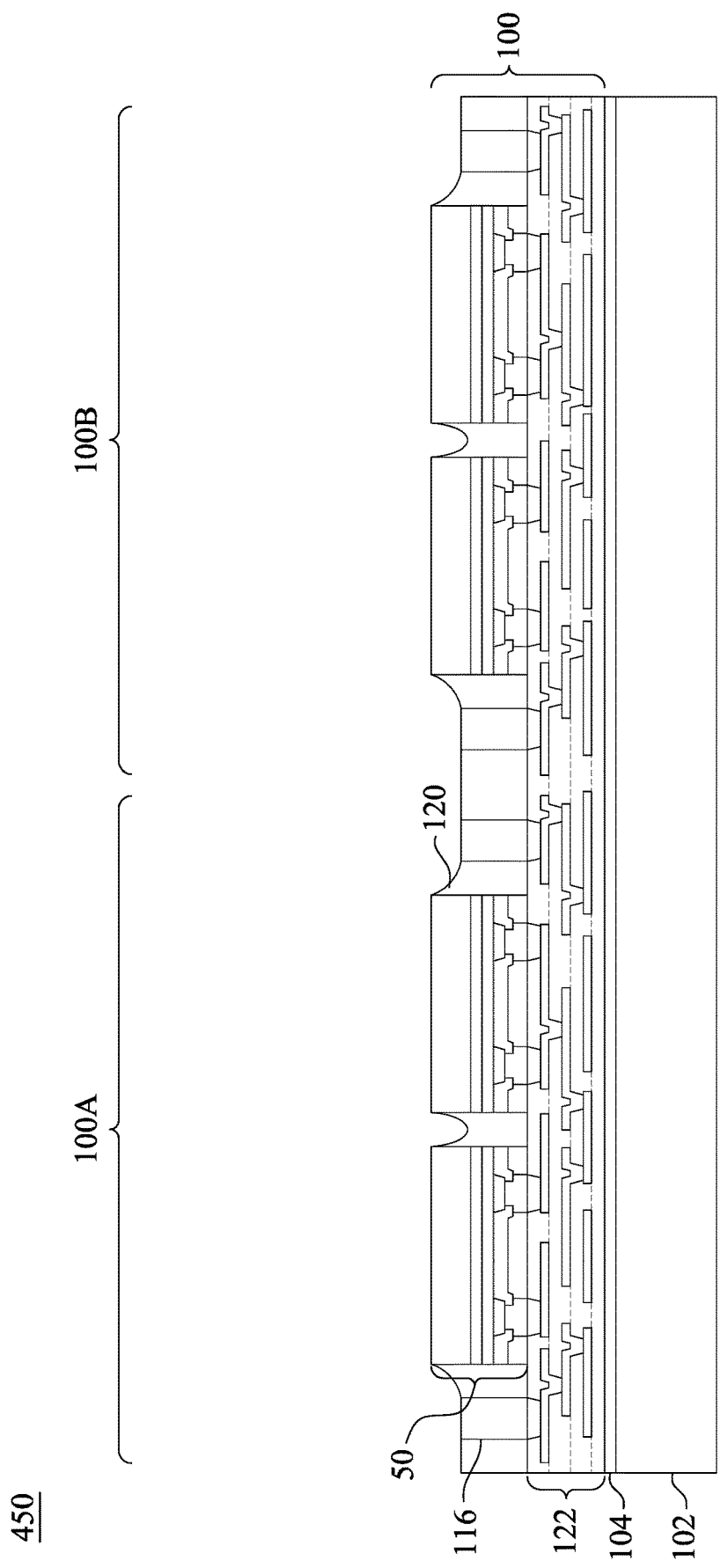

In FIG. 16, an encapsulant 120 is formed on and around the various components. After formation, the encapsulant 120 extends along sidewalls of the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 disposed in the encapsulant 120. The encapsulant 120 may be applied in liquid or semi-liquid form and then subsequently cured.

The encapsulant 120 is formed in gap regions between the integrated circuit dies 50. However, the encapsulant 120 may be deposited to not cover top surfaces of the through vias 116. For example, after the encapsulant 120 is deposited, top surfaces of the through vias 116 may remain exposed without any patterning or planarization process being applied to the encapsulant 120. Alternatively, the encapsulant 120 may be deposited to bury the through vias 116, and an etch back process may be applied to expose top surfaces of the through vias 116. In such embodiments, the etch back process may be isotropic.

In some embodiments, the encapsulant 120 may further include a fillet along at least an upper portion of the sidewalls of the dies 50. Although FIG. 16 illustrate a top surface of the encapsulant 120 being at a same level as the top surfaces of the through vias 116, the encapsulant 120 may also have a top surface lower than the top surfaces of the through vias 116 in other embodiments.

Figure 17:
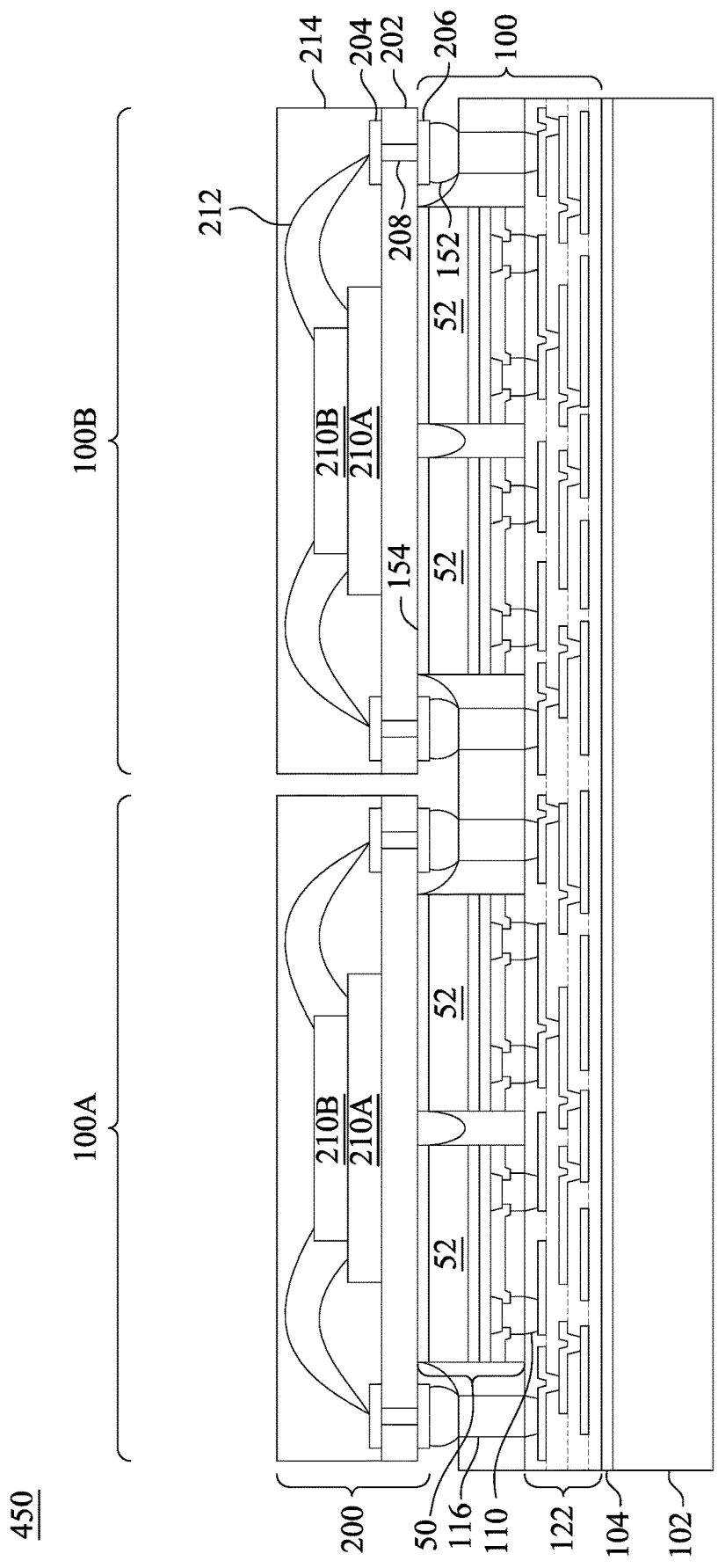

In FIG. 17, the second package components 200 are coupled to the first package component 100. One of the second package components 200 are coupled in each of the package regions 100A and 100B to form an integrated circuit device stack in each region of the first package component 100. For example, the second package components 200 may be bonded directly to the through vias 116 by reflowing conductive connectors 152. The second package components 200 may be similar to those described above in FIG. 7, and additional details of the second package components 200 are omitted for brevity.

In the packages 450, the dies 50 may be directly attached to the second package component 200 by a film 154. The film 154 may be a high-k polymer (e.g., a high-k DAF), a metal (e.g., In, Sn, or the like), a TIM, solder paste, or the like. For example, the substrates 52 of the dies 50 may be attached to the substrate 202 of the second package component 200 by the film 154. Because the substrates 52 comprise a semiconductor material (e.g., having a relatively high thermal conductivity), heat dissipation may be facilitated by placing it in close proximity to the second package component 200. Heat dissipation may further be improved by using a material with relatively high thermal conductivity (e.g., the film 154) as an interfacing material between the dies 50 and the substrates 202. For example, it has been observed that by operating temperatures in the completed package may be reduced by at least 18% by attaching the dies 50 directly to the second package component 200 with a relatively high thermal conductivity material.

Figure 18:
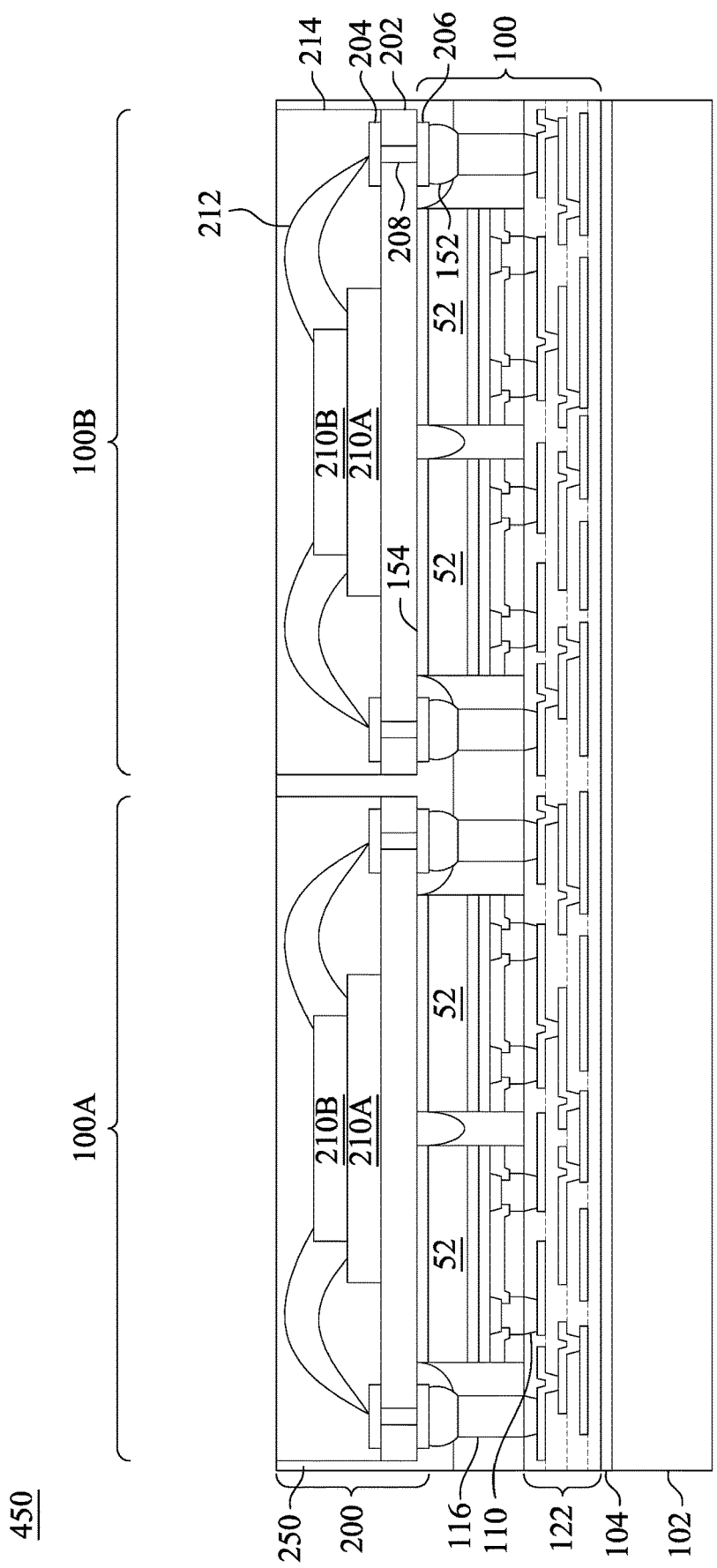

In FIG. 18, the encapsulant 250 is formed between the first package component 100 and the second package components 200, surrounding the conductive connectors 152. The encapsulant 250 may be formed in a similar manner and of a similar material as described above in FIG. 8. The encapsulant 250 may have a lower thermal conductivity than the substrates 52 of the dies 50. Because the dies 50 are directly attached to the second package component 200 by the film 154, the encapsulant 250 may not extend between a top surface of the dies 50 and the bottom surface of the substrate 202 in a directly perpendicular to the top surface of the dies 50. Accordingly, thermal dissipation can be improved.

Figure 19:
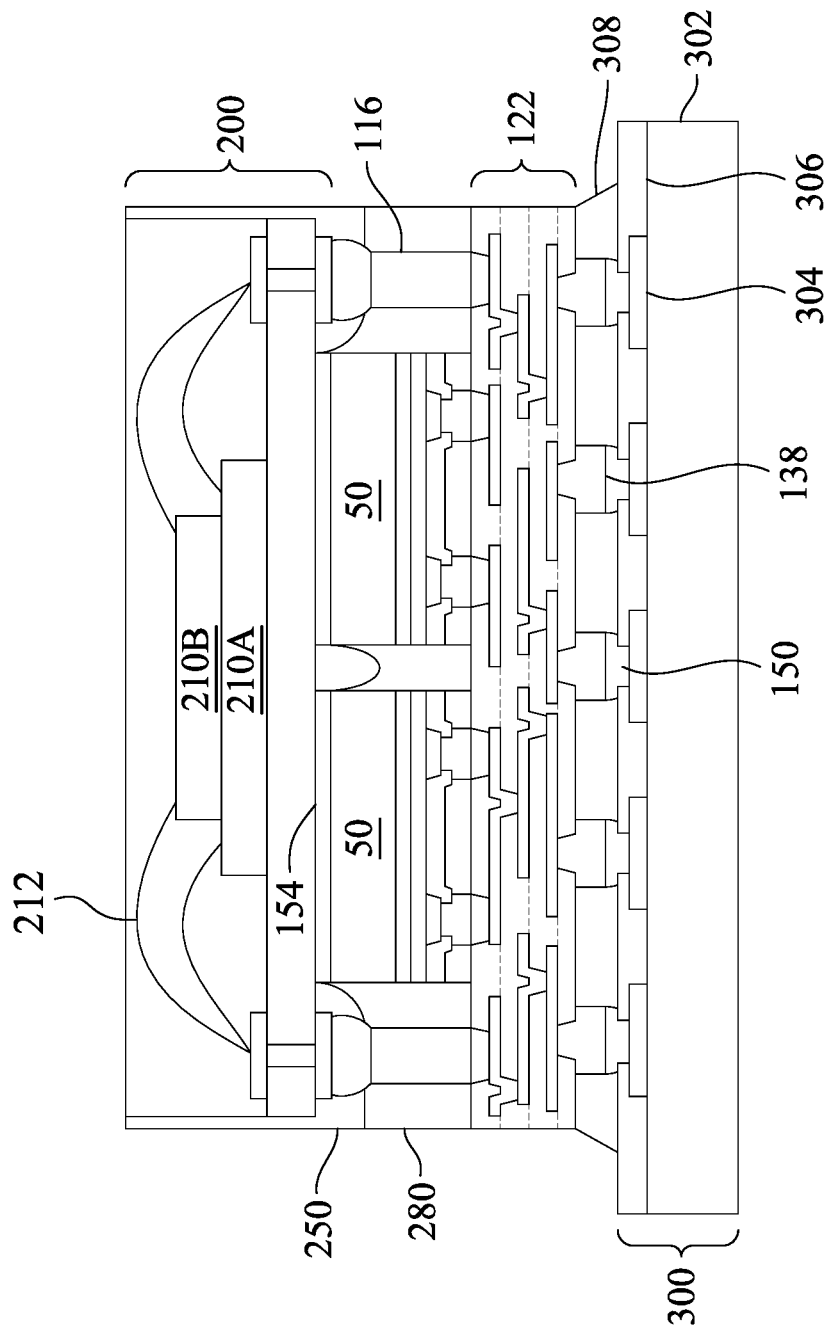

In FIG. 19, additionally processing similar to that described above with respect to FIGS. 9 through 13 may be performed to singulate and bond the first and second package components 100 and 200 to a third package component 300. Thus, a semiconductor package 450 is formed comprising the first package component 100 bonded to the second package component 200 and the third package component 300. A substrate 52 of the dies 50 of the first package component 100 is directly attached to a substrate 202 of the second package component 200 to improve heat dissipation from dies 50 of the first package component 100 to the second package component 200. The substrate 52 of the dies 50 may have a relatively high thermal conductivity, for example, higher than a thermal conductivity of the encapsulant 250 between the first package component 100 and the second package component 200. As such, improved heat dissipation and device performance can be achieved in the semiconductor package 450. For example, operating temperatures in the semiconductor package 450 may be reduced by 18%.

Figure 20:
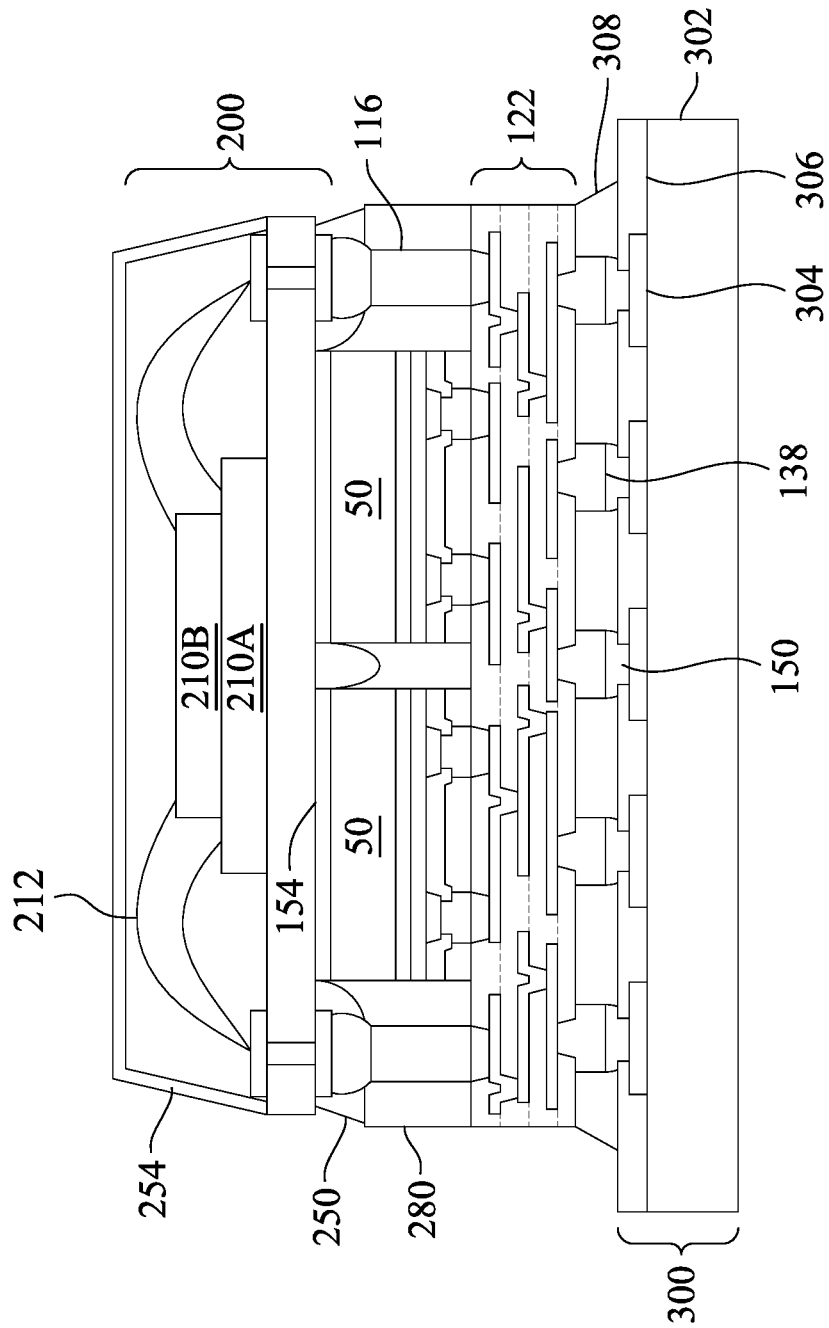
FIG. 20 illustrates a cross-sectional view of a semiconductor package in accordance with some embodiments.

FIG. 20 illustrates a cross-sectional view of a semiconductor packages 460. The semiconductor package 460 may be similar to the semiconductor package 450 where like reference numerals indicate like elements formed using like processes. However, the second package component 200 in the semiconductor package 460 may further include a heat dissipation lid 254, which is attached to the substrate 202 of the second package component 200. The heat dissipation lid 254 may be made of a conductive material with high thermal conductivity, such as copper or the like, and the heat dissipation lid 254 may be attached to the top surface of the substrate 202 by an adhesive, a thermal interface material (TIM), or the like. The substrate 202 thermally connects the dies 50 to the heat dissipation lid 254. Further, in the semiconductor package 460, the encapsulant 250 may only be formed between the first package component 100 and the second package component 200, and the encapsulant 250 may not extend along the sidewalls of the second package component 200.

FIGS. 21 through 29 illustrate cross-sectional views of forming a semiconductor package 470 according to some other embodiments. Package 470 may be similar to package 400 of FIG. 12 where like reference numerals indicate like elements formed by like processes.

In FIG. 20, a carrier substrate 102 is provided, and a release layer 104 is formed on the carrier substrate 102. A back-side redistribution structure 106 may be formed on the release layer 104. In the embodiment shown, the back-side redistribution structure 106 includes a dielectric layer 108, a metallization pattern 111 (sometimes referred to as redistribution layers or redistribution lines), a metallization pattern 110, and a dielectric layer 112. The metallization patterns 110 and 111 may be formed of a similar process and a similar material as the metallization pattern 136 described above. The back-side redistribution structure 106 is optional. In some embodiments, a dielectric layer without metallization patterns is formed on the release layer 104 in lieu of the back-side redistribution structure 106.

Figure 21:
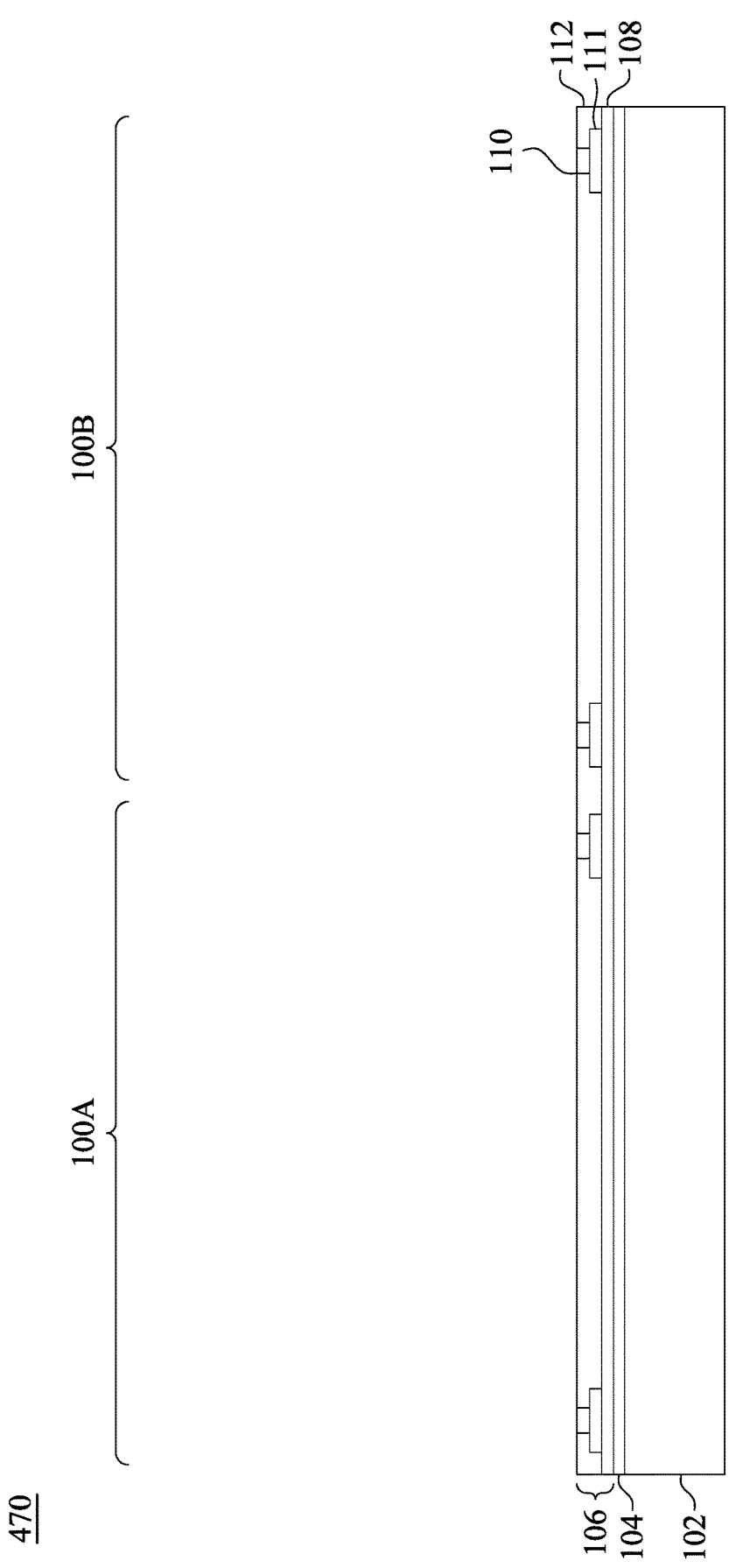
FIGS. 21 through 29 illustrate cross-sectional views of intermediate steps during a process for forming a package component and implementation of device stacks in accordance with some embodiments.

In FIG. 21, openings 113 are patterned through the back-side redistribution pattern 113. The openings 113 may be patterned using a combination of photolithography and etching, for example. The openings may expose the release layer 104.

Figure 22:
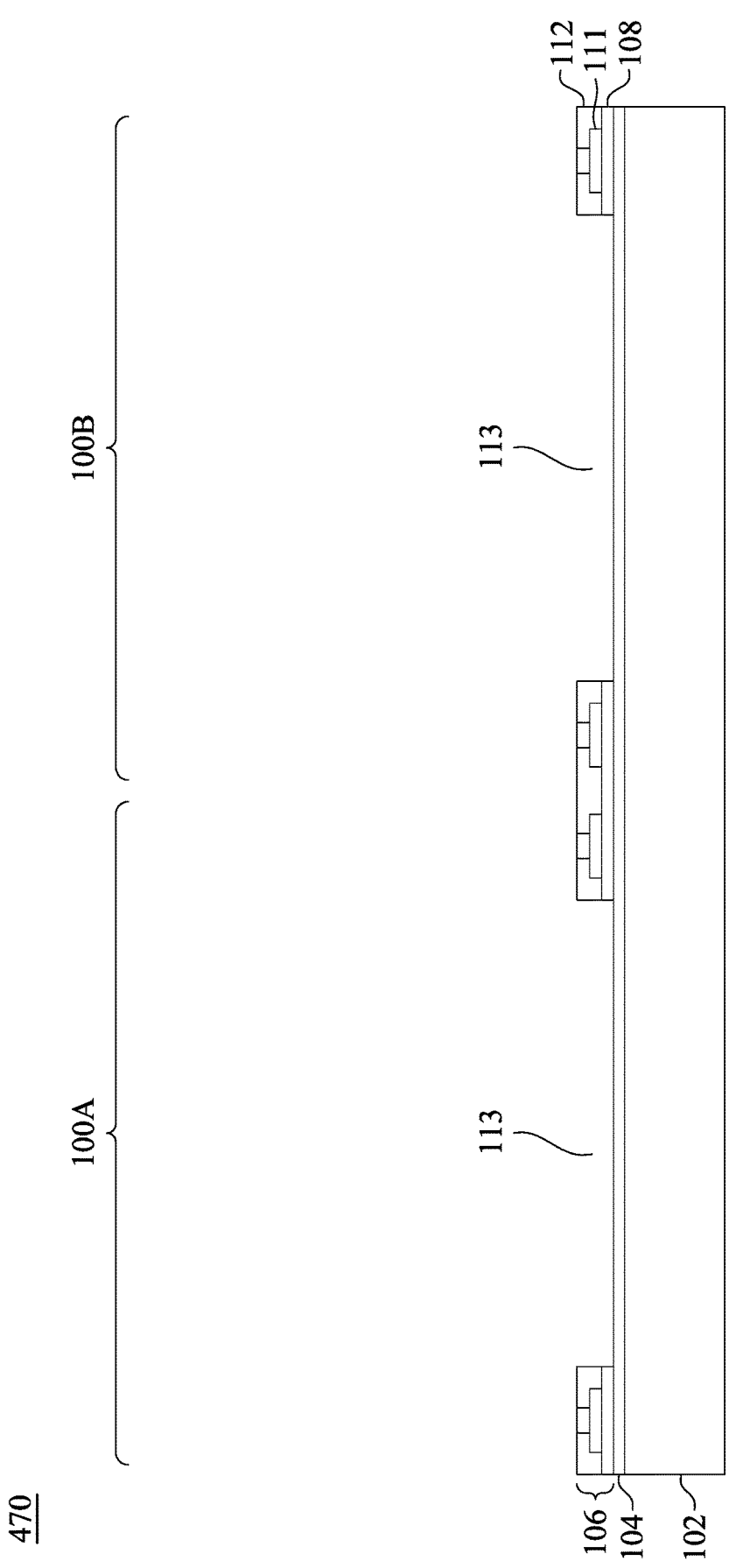

In FIG. 22, heat spreaders 170 are formed in the openings 113. The heat spreaders 170 may be formed, for example in a similar manner as the metallization patterns 110 and 111. The heat spreaders 170 may comprise a conductive material having a relatively high thermal conductivity such as copper, or the like. In some embodiments, the heat spreaders 170 may have a thermal conductivity of at least about 380 W/m*K. In some embodiments, the heat spreaders 170 may be formed to cover top surfaces of the dielectric layer 112, and a planarization process may be used to remove excess portions of the heat spreaders 170 and to expose the metallization pattern 110.

Figure 23:
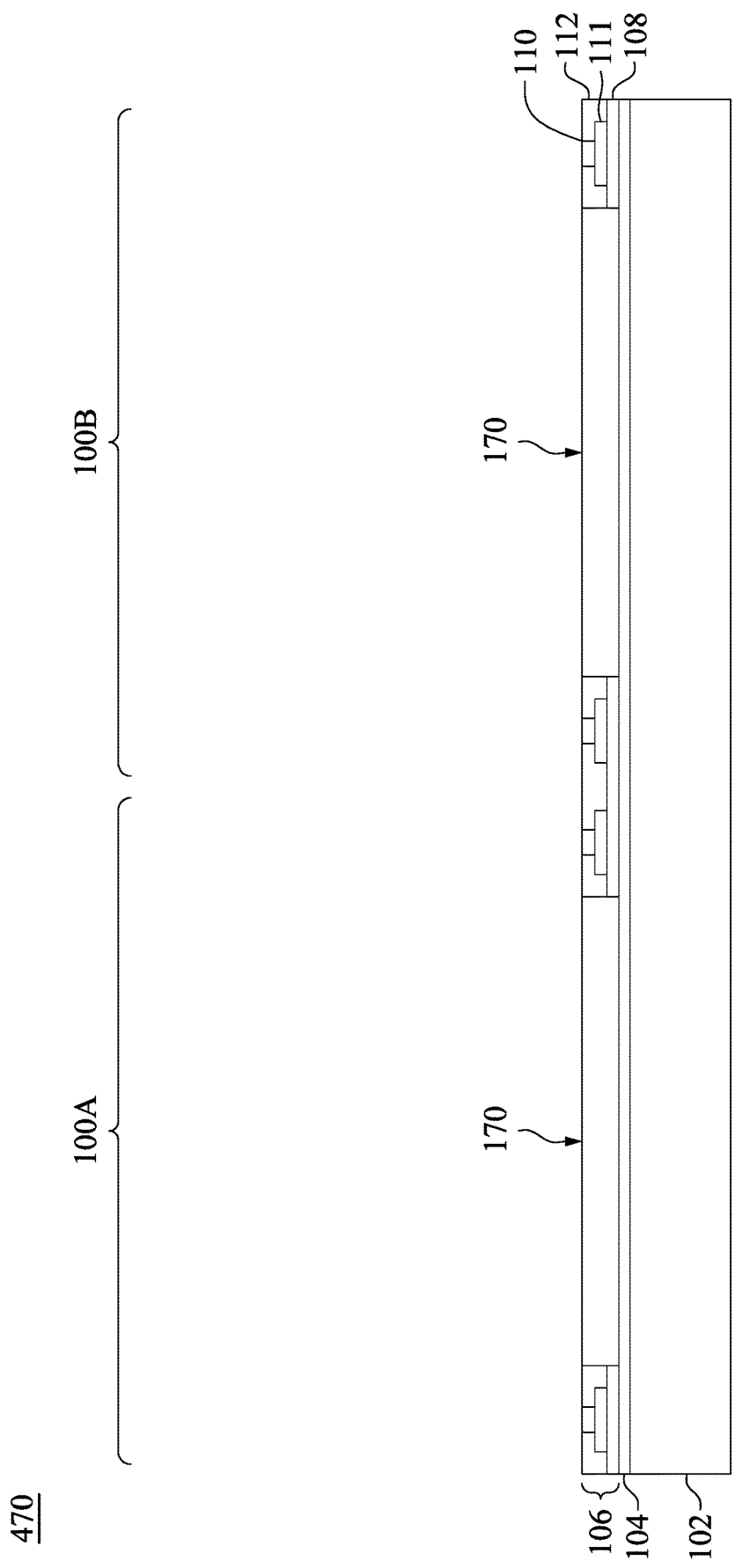

In FIG. 23, through vias 116 are formed on the metallization pattern 110. The through vias 116 may extending away from the topmost dielectric layer of the back-side redistribution structure 106 (e.g., the dielectric layer 112). The through vias 116 may be formed using a similar process and a similar material as described above in FIG. 3.

Figure 24:
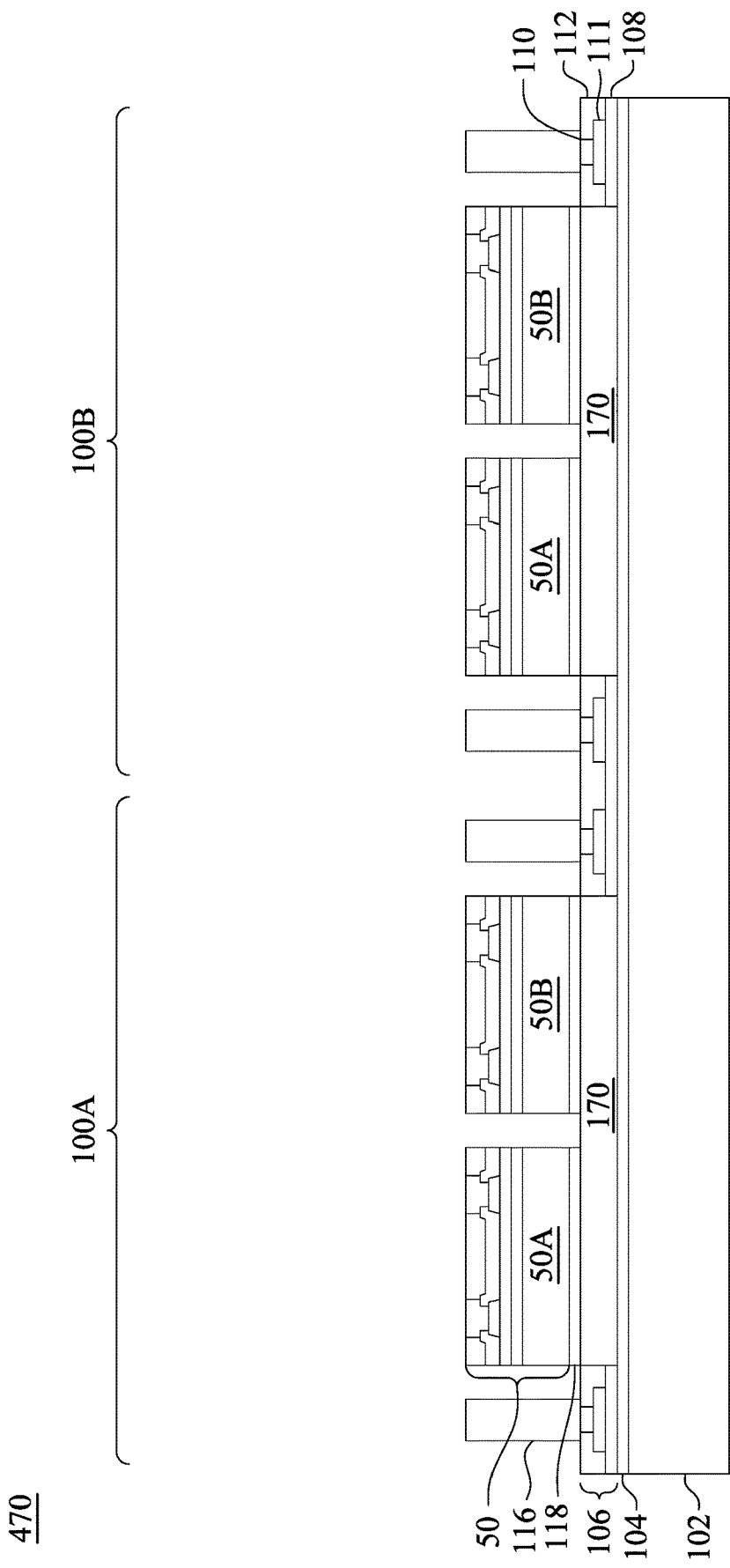
Figure 25:
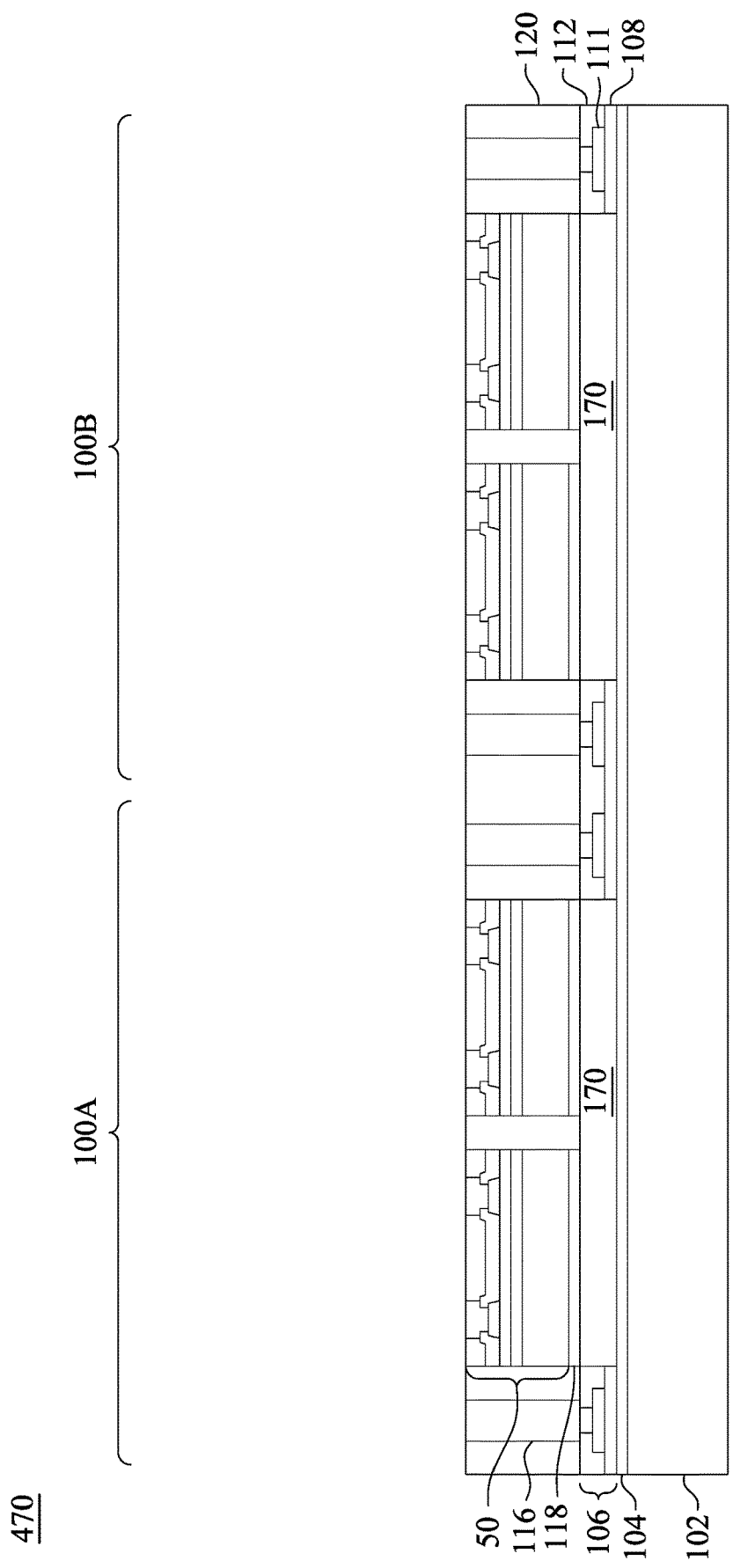

In FIG. 24, integrated circuit dies 50 (e.g., a first integrated circuit die 50A and a second integrated circuit die 50B) are adhered to the heat spreaders 170 by an adhesive 118. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when the integrated circuit dies 50 include devices with a large footprint, such as SoCs. Use of the back-side redistribution structure 106 allows for an improved interconnect arrangement when the first package region 100A and the second package region 100B have limited space available for the through vias 116.

The adhesive 118 is on back-sides of the integrated circuit dies 50 and adheres the integrated circuit dies 50 to the heat spreaders 170. The adhesive 118 may be a high-k polymer (e.g., a high-k DAF), a metal (e.g., In, Sn, or the like) attached by a reflow process, a thermal interface material (TIM), solder paste, or the like. The adhesive 118 may be applied to back-sides of the integrated circuit dies 50 or may be applied to an upper surface of the back-side redistribution structure 106. For example, the adhesive 118 may be applied to the back-sides of the integrated circuit dies 50 before singulating to separate the integrated circuit dies 50. The adhesive 118 may have a relatively high thermal conductivity to promote heat dissipation from the dies 50 to the heat spreaders 170.

Figure 26:
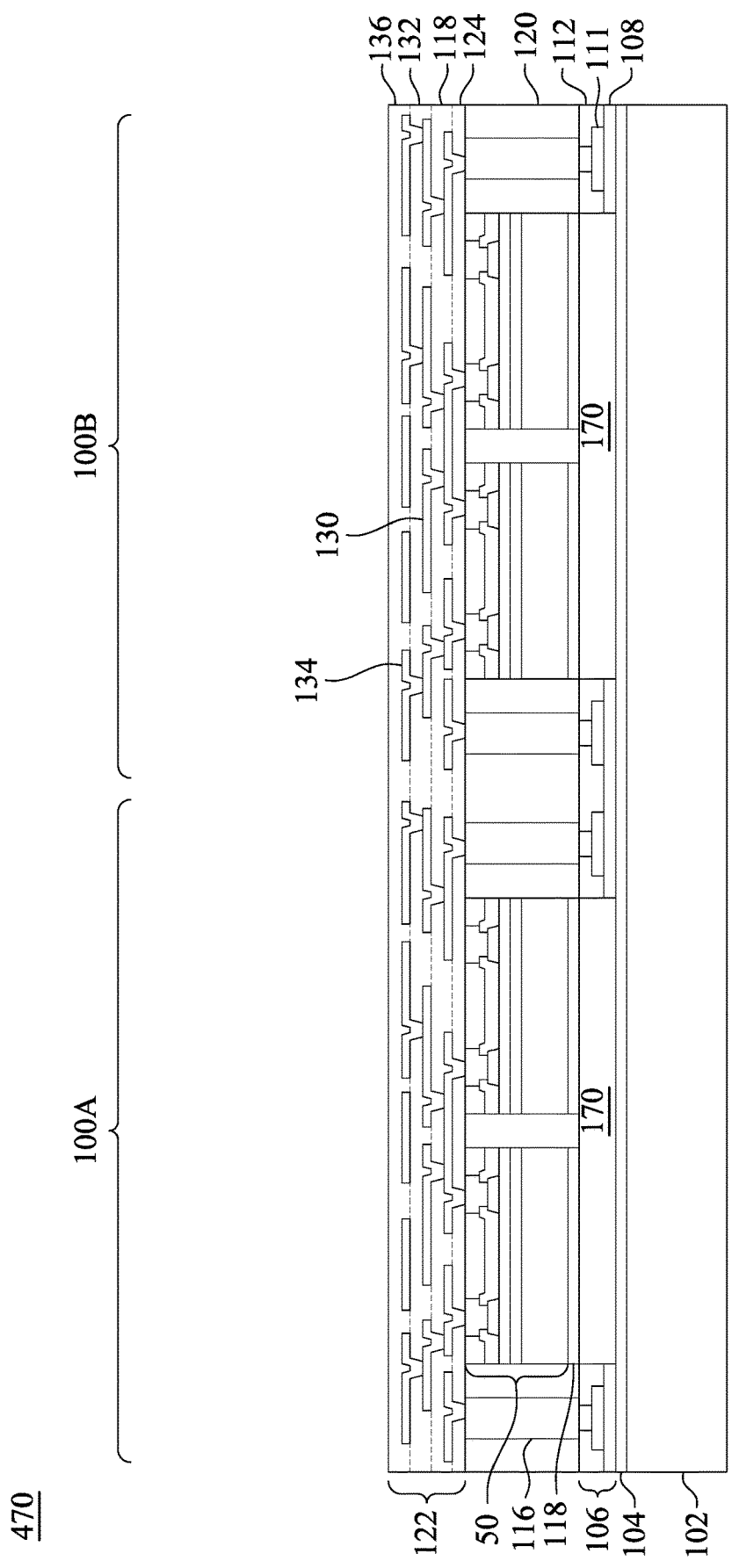

In FIG. 26, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

A planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or die connectors 66 are already exposed.

In FIG. 26, a front-side redistribution structure 122 is formed over the encapsulant 120, through vias 116, and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. The front-side redistribution structure 122 may be formed using the process and/or materials described in FIG. 3.

Figure 27:
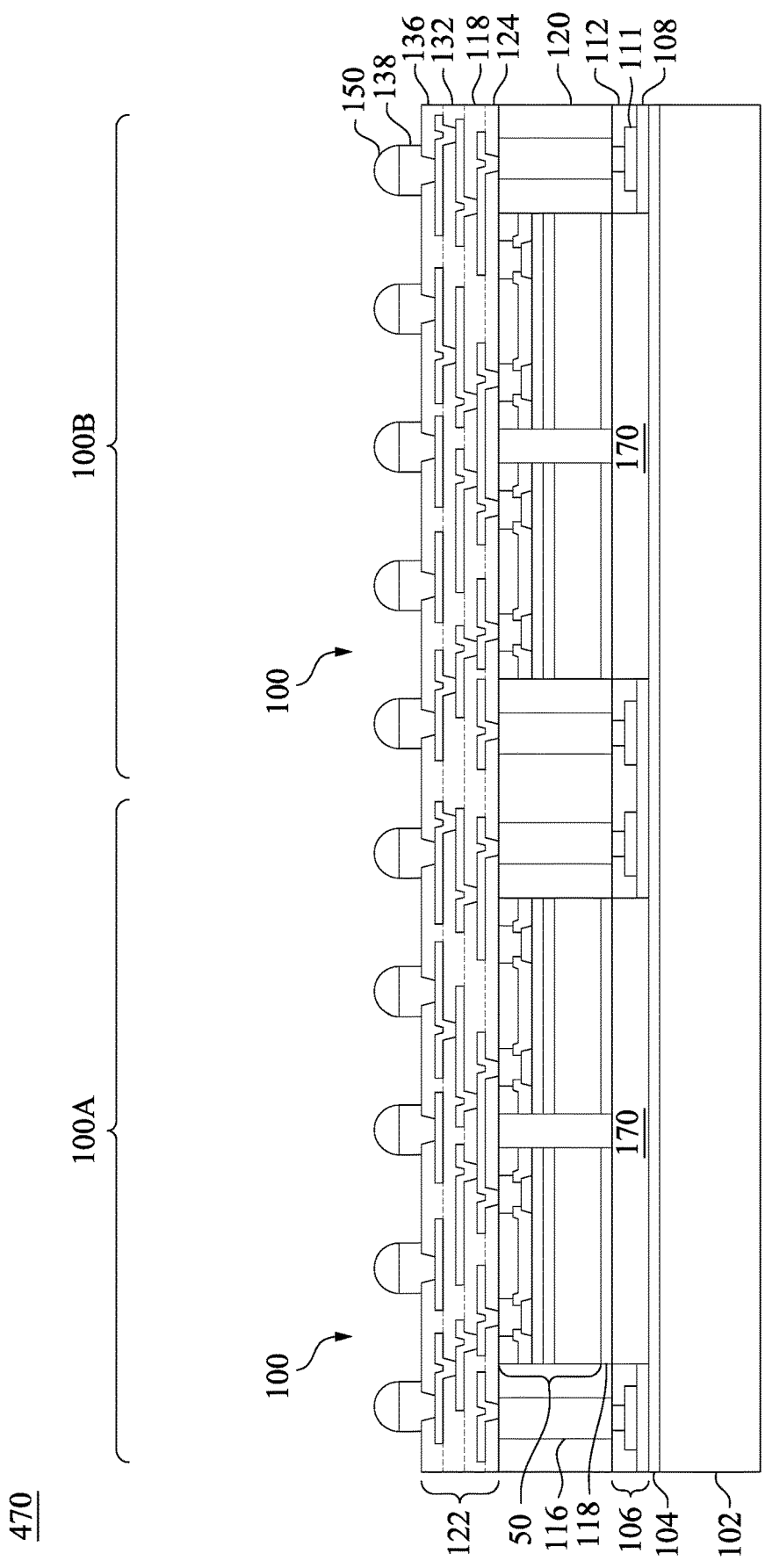

In FIG. 27, UBMs 138 and conductive connectors 150 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50. The UBMs 138 may be formed of the same material as the metallization pattern 126. In some embodiments, the UBMs 138 has a different size than the metallization patterns 126, 130, and 134.

Conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. Thus, a first package component 100 is formed comprising the backside redistribution structure 106, the heat spreaders 170, the through vias 116, the dies 50, the encapsulant 120, the front-side redistribution structure 122, the UBMs 138, and the conductive connectors 150.

Figure 28:
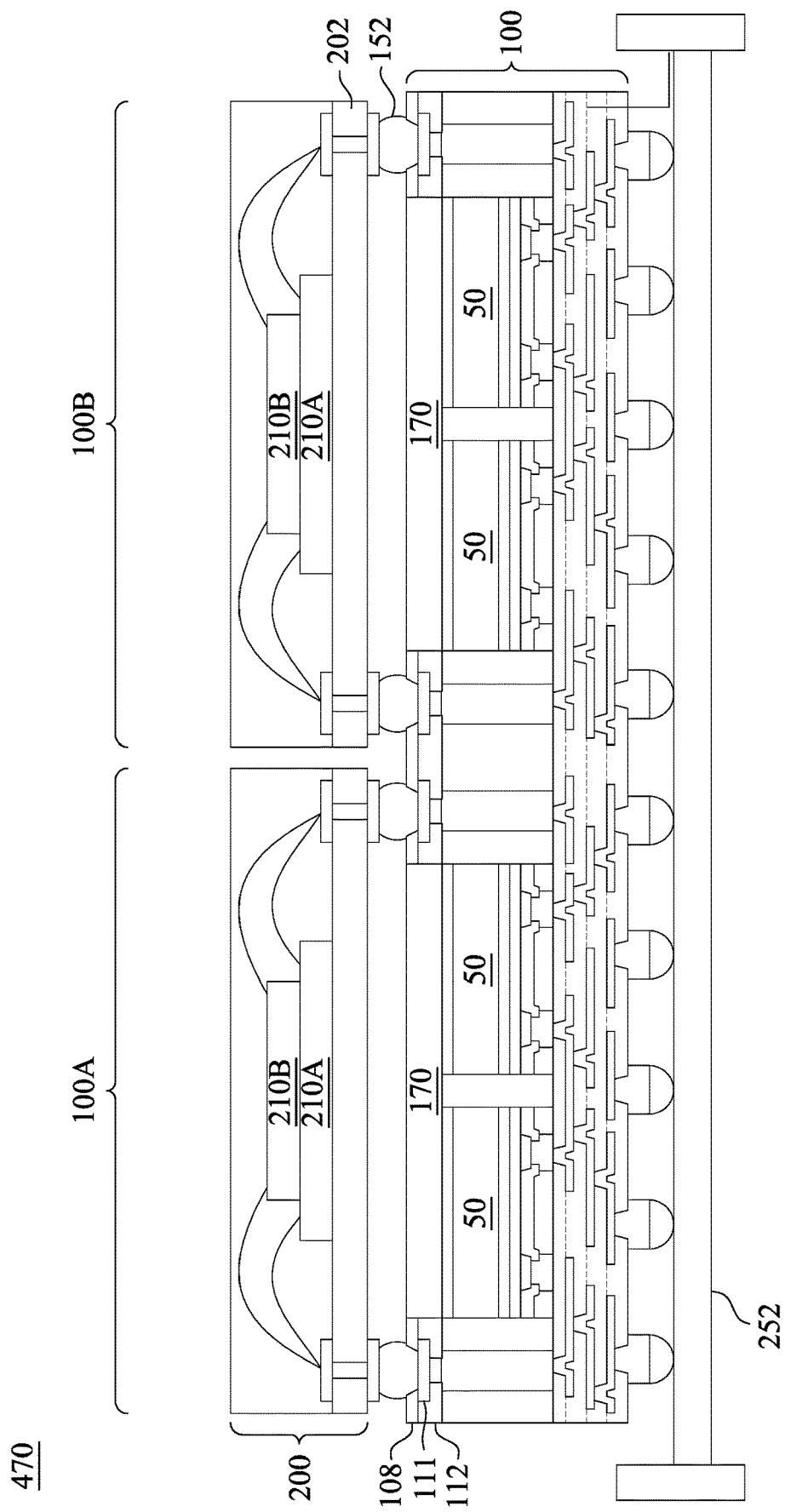

In FIG. 28, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed.

Further in FIG. 28, openings 115 are formed through the dielectric layer 108 to expose portions of the metallization pattern 111. The openings 115 may be formed, for example, using laser drilling, etching, or the like.

Subsequently, the second package component 200 is attached to the first package component 100 in a similar manner as described above with respect to FIG. 7. For example, conductive connectors extend through the openings in the dielectric layer 108 to electrically connect the metallization pattern 111 of the first package component 100 to the second package component 200. The heat spreader 170 may be disposed between dies 50 of the first package component 100 and the substrate 202 of the second package component 200 in order to improve heat dissipation from the dies 50 to the second package component 200.

Figure 29:
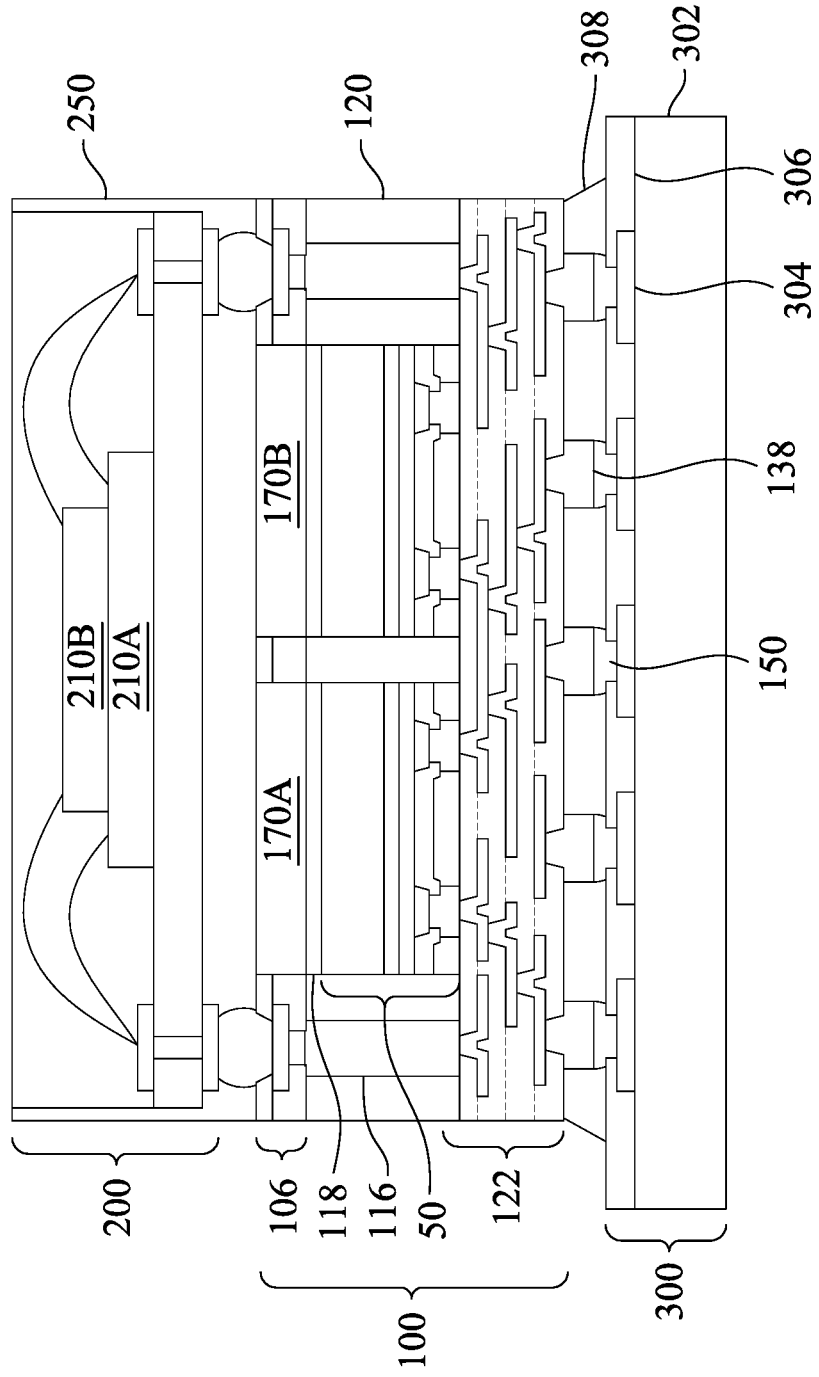

Additional processing (e.g., similar to that described about with respect to FIGS. 8, 12, and 13) may be performed to arrive at the package 470 of FIG. 29. Package 470 may include heat spreaders 170 formed within the back-side redistribution structure 106 of the first package component 100. By placing the heat spreaders 170 between the dies 50 and the second package component 200, heat dissipation and device performance may be improved.

Figure 30:
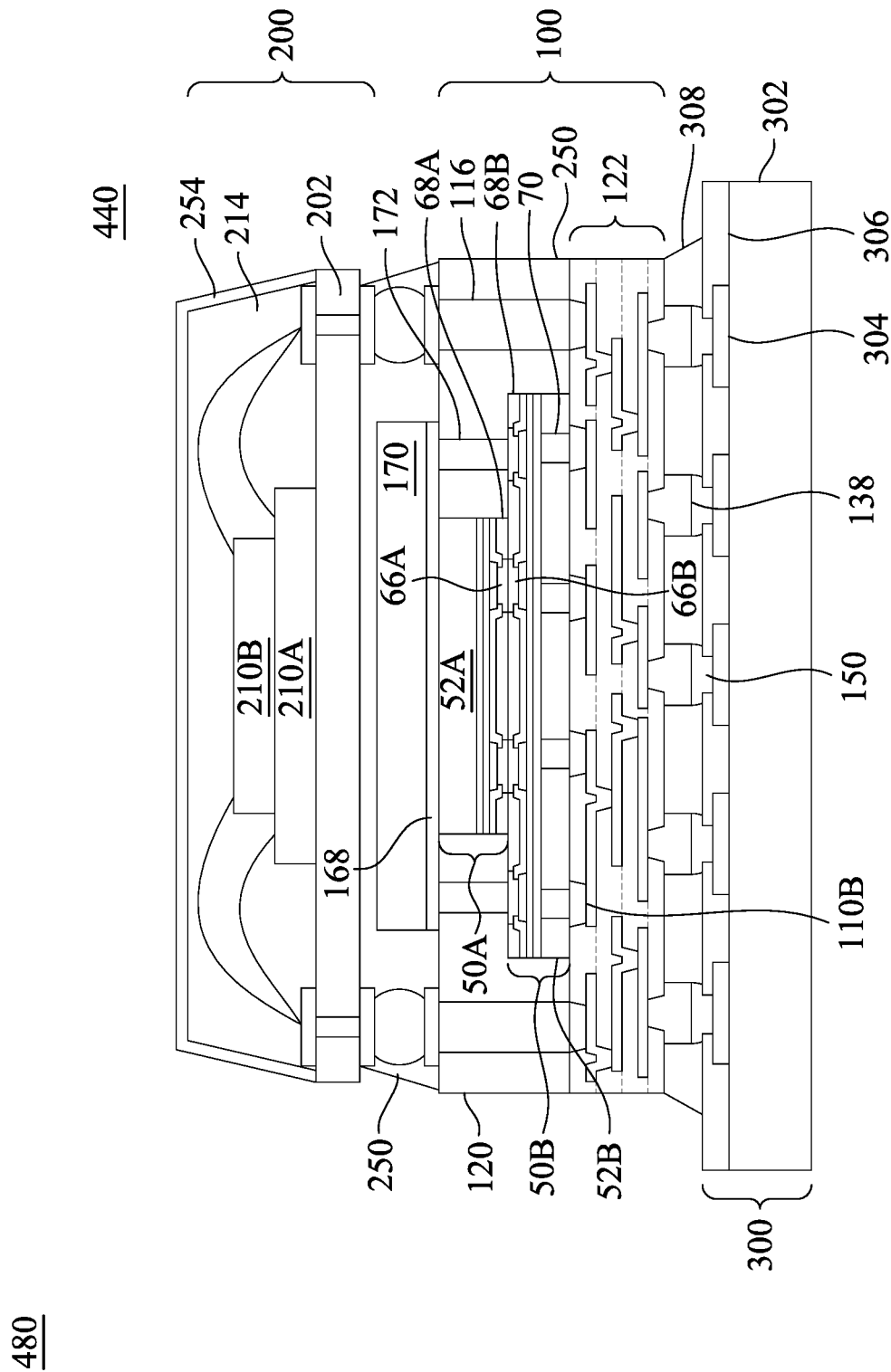
FIG. 30 illustrates a cross-sectional view of a semiconductor package in accordance with some embodiments.

FIG. 30 illustrates a cross-sectional view of a semiconductor package 480 according to some alternate embodiments. The semiconductor package 480 is similar to the semiconductor package 400 where like reference numerals indicate like elements formed by like processes. However, the dies 50 in the semiconductor package 480 are directly bonded to each other in a stacked configuration. In some embodiments, the die 50A may be directly bonded to the die 50B by a hybrid bonding process described above. For example, the passivation layer 68A of the die 50A may be directly bonded to the passivation layer 68B of the die 50B with dielectric-to-dielectric bonds, and the die connectors 66A of the die 50A may be directly bonded to the die connectors 66B of the die 50B with metal-to-metal bonds. Further, the dies 50B may include through substrate vias (TSVs) 70 that extend through the substrate 52 of the dies 50B. The TSVs 70 may be directly bonded to the contact pads 110B of the front-side redistribution layer 122 using a hybrid bonding configuration for example.

Both the dies 50A and 50B are thermally connected to the heat spreader 170 in the package 480. For example, the heat spreader 170 may be directly attached to a substrate 52A of the die 50A through a film 168. Further, the thermal vias 172 may be formed on conductive connectors 66B of the dies 50B, and the thermal vias 172 may thermally connect the die 50B to the heat spreader 170. In some embodiments, the thermal vias 172 are formed of a similar material and in a similar process as the through vias 116. In some embodiments, the thermal vias 172 may be dummy vias which are not electrically connected to any active devices in the dies 50A and 50B. Thus, thermal dissipation may be achieved in the package 480 through the heat spreader 170, which is thermally connected to the dies 50A and 50B. Heat may also dissipate from the die 50B through the front-side redistribution structure 122.

In accordance with some embodiments, a package includes a memory package component bonded to an integrated circuit (IC) package component, which comprises one or more IC dies. In some embodiments, a heat spreader having a relatively high thermal conductivity is disposed between the memory package component and the IC package component for improved heat dissipation. For example, the heat spreader may be attached to a backside of the IC die, and the heat spreader may extend from the IC die to the memory package. In other embodiments, the IC die may be directly attached to the memory package for improved heat dissipation. According, in embodiment semiconductor packages, heat may be effectively dissipated from the IC die to the heat sink through the heat spreader or by directly attaching the IC die to the memory package.

In some embodiments, a semiconductor package includes a first package component comprising: a first semiconductor die; a first encapsulant around the first semiconductor die; and a first redistribution structure electrically connected to the semiconductor die. The semiconductor package further includes a second package component bonded to the first package component, wherein the second package component comprises a second semiconductor die; a heat spreader between the first semiconductor die and the second package component; and a second encapsulant between the first package component and the second package component, wherein the second encapsulant has a lower thermal conductivity than the heat spreader. Optionally, in some embodiments, the heat spreader has a thermal conductivity of at least 149 W/m*K. Optionally, in some embodiments, the heat spreader contacts a substrate of the second package component. Optionally, in some embodiments, the second encapsulant extends between a top surface of the heat spreader and a bottom surface of a substrate of the second package component. Optionally, in some embodiments, the heat spreader is attached to a semiconductor substrate of the first semiconductor die by a film. Optionally, in some embodiments, the film comprises a high-k polymer, indium, tin, a thermal interface material (TIM), or solder paste. Optionally, in some embodiments, a second heat spreader is disposed between the first semiconductor die and the second package component, and wherein the second encapsulant is between the heat spreader and the second heat spreader. Optionally, in some embodiments, the semiconductor package further includes a heat dissipation lid attached to a top surface of a substrate of the second package component, wherein the first package component is attached to a bottom surface of the substrate of the second package component. Optionally, in some embodiments, the second encapsulant is disposed along sidewalls of the second package component.

In some embodiments, a semiconductor package includes a first package component comprising: a first semiconductor die comprising a first semiconductor substrate; a first encapsulant around the first semiconductor die; and a first redistribution structure electrically connected to the semiconductor die. The semiconductor package further includes a second package component bonded to the first package component, wherein the second package component comprises a second semiconductor die on a second semiconductor substrate, and wherein the first semiconductor substrate is directly attached to the second semiconductor substrate by a film; and a second encapsulant between the first package component and the second package component. Optionally, in some embodiments, the second encapsulant has a lower thermal conductivity than the first semiconductor substrate. Optionally, in some embodiments, the film comprises a high-k polymer, indium, tin, a thermal interface material (TIM), or solder paste. Optionally, in some embodiments, the semiconductor package further includes a conductive via in the first encapsulant, wherein the first semiconductor die extends higher than the through via. Optionally, in some embodiments, the second encapsulant extends below a top surface of the first semiconductor die.

In some embodiments, a method includes forming a redistribution structure, wherein the redistribution structure comprises a first contact pad and a second contact pad in an insulating layer; forming a through via on the second contact pad; bonding a first die to the redistribution structure, wherein a dielectric layer of the first die contacts the insulating layer, and wherein a third contact pad of the first die contacts the first contact pad; attaching a heat spreader to a surface of the first die opposite the redistribution structure; and bonding a package component comprising a second die to the through via, wherein the heat spreader is between the first die and the package component. Optionally, in some embodiments, the method further includes encapsulating the through via and the first die in a first encapsulant. Optionally, in some embodiments, the method further includes dispensing a second encapsulant around the heat spreader and between the first die and the package component, wherein the heat spreader has a high thermal conductivity than the second encapsulant. Optionally, in some embodiments, the method further includes dispensing the second encapsulant between a top surface of the heat spreader and a bottom surface of the package component. Optionally, in some embodiments, bonding the package component comprises contacting the heat spreader to the package component. Optionally, in some embodiments, attaching the heat spreader to the surface of the first die opposite the redistribution structure comprises attaching the heat spreader to the surface of the first die with a film, and wherein the film comprises a high-k polymer, indium, tin, a thermal interface material (TIM), or solder paste.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprises:
   a first package component comprising:
      a first semiconductor die;
      a first encapsulant around the first semiconductor die;
      a first redistribution structure electrically connected to the first semiconductor die; and
      a contact pad on a surface of the first encapsulant opposite to the first redistribution structure;
   a second package component bonded to the first package component, wherein the second package component comprises a second semiconductor die, wherein the second package component is directly bonded to the contact pad;
   a heat spreader between the first semiconductor die and the second package component wherein the heat spreader is attached to a semiconductor substrate of the first semiconductor die by a film; and
   a second encapsulant between the first package component and the second package component, wherein the second encapsulant has a lower thermal conductivity than the heat spreader, wherein an interface between the semiconductor substrate of the first semiconductor die and the film is level with an interface between the second encapsulant and the first encapsulant, and wherein the interface between the semiconductor substrate of the first semiconductor die and the film is level with an interface between the contact pad and the first encapsulant.

2. The semiconductor package of claim 1, wherein the heat spreader has a thermal conductivity of at least 149 W/m*K.

3. The semiconductor package of claim 1, wherein the heat spreader contacts a substrate of the second package component.

4. The semiconductor package of claim 1, wherein the second encapsulant extends between a top surface of the heat spreader and a bottom surface of a substrate of the second package component.

5. The semiconductor package of claim 1, wherein the film comprises a high-k polymer, indium, tin, a thermal interface material (TIM), or solder paste.

6. The semiconductor package of claim 1, wherein a second heat spreader is disposed between the first semiconductor die and the second package component, and wherein the second encapsulant is between the heat spreader and the second heat spreader.

7. The semiconductor package of claim 1 further comprising a heat dissipation lid attached to a top surface of a substrate of the second package component, wherein the first package component is attached to a bottom surface of the substrate of the second package component.

8. The semiconductor package of claim 1, wherein the second encapsulant is disposed along sidewalls of the second package component.

9. A semiconductor package comprises:
a first package component comprising:
  a first semiconductor die comprising a first semiconductor substrate;
  a first encapsulant around the first semiconductor die; and
  a first redistribution structure electrically connected to the first semiconductor die;
a second package component bonded to the first package component, wherein the second package component comprises a second semiconductor die on a second semiconductor substrate, and wherein the first semiconductor substrate is directly attached to the second semiconductor substrate by a film;
a second encapsulant between the first package component and the second package component; and
a conductive via extending completely through the first encapsulant wherein a surface of the first encapsulant that faces the second package includes a curved portion that extends continuously from a first level of a top surface of the semiconductor die to a second level of a top surface of the conductive via, the first level being higher than the second level.

10. The semiconductor package of claim 9, wherein the second encapsulant has a lower thermal conductivity than the first semiconductor substrate.

11. The semiconductor package of claim 9, wherein the film comprises a high-k polymer, indium, tin, a thermal interface material (TIM), or solder paste.

12. The semiconductor package of claim 9, wherein the second encapsulant extends below a top surface of the first semiconductor die.

13. A method comprising:
forming a redistribution structure, wherein the redistribution structure comprises a first contact pad and a second contact pad in an insulating layer;
forming a through via on the second contact pad;
after forming the redistribution structure, directly bonding a first die to the redistribution structure, wherein directly bonding the first die to the redistribution structure comprises directly bonding a dielectric layer of the first die to the insulating layer and directly bonding a third contact pad of the first die to the first contact pad;
after directly bonding the first die to the redistribution structure, attaching a heat spreader to a surface of the first die opposite the redistribution structure; and
bonding a package component comprising a second die to the through via, wherein the heat spreader is between the first die and the package component.

14. The method according to claim 13 further comprising encapsulating the through via and the first die in a first encapsulant.

15. The method according to claim 13 further comprising dispensing a second encapsulant around the heat spreader and between the first die and the package component, wherein the heat spreader has a high thermal conductivity than the second encapsulant.

16. The method according to claim 15, further comprising dispensing the second encapsulant between a top surface of the heat spreader and a bottom surface of the package component.

17. The method according to claim 13, wherein bonding the package component comprises contacting the heat spreader to the package component.

18. The method according to claim 13, wherein attaching the heat spreader to the surface of the first die opposite the redistribution structure comprises adhering the heat spreader to the surface of the first die with a film, and wherein the film comprises a high-k polymer, indium, tin, a thermal interface material (TIM), or solder paste.

19. The semiconductor package of claim 1, wherein an interface between the heat spreader and the film is disposed closer to the second package component than the interface between the second encapsulant and the first encapsulant.

20. The semiconductor package of claim 12, wherein the second encapsulant directly contacts a sidewall of the first semiconductor die.

* * * * *